(12) United States Patent
Kozawa et al.

(10) Patent No.: US 7,364,829 B2
(45) Date of Patent: Apr. 29, 2008

(54) RESIST PATTERN THICKENING MATERIAL, PROCESS FOR FORMING RESIST PATTERN, AND PROCESS FOR MANUFACTURING SEMICONDUCTOR DEVICE

(75) Inventors: Miwa Kozawa, Kawasaki (JP); Koji Nozaki, Kawasaki (JP); Takahisa Namiki, Kawasaki (JP); Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 39 days.

(21) Appl. No.: 10/629,806

(22) Filed: Jul. 30, 2003

(65) Prior Publication Data

US 2004/0121259 A1 Jun. 24, 2004

(30) Foreign Application Priority Data

Aug. 21, 2002 (JP) ............................ 2002-240082

(51) Int. Cl.
*G03C 1/73* (2006.01)
*G03F 7/038* (2006.01)
*G03F 7/30* (2006.01)
*G03F 7/36* (2006.01)
*G03F 7/38* (2006.01)

(52) U.S. Cl. .................. 430/270.1; 430/909; 430/311; 430/313; 430/319; 430/331; 430/325; 430/326; 430/9

(58) Field of Classification Search .............. 430/270.1, 430/909, 905, 311, 313, 323, 324, 325, 326; 216/41, 47, 49

See application file for complete search history.

(56) References Cited

U.S. PATENT DOCUMENTS 4,503,174 A 3/1985 Vasta .......................... 523/439
4,572,870 A * 2/1986 Vasta .......................... 428/416
5,858,620 A 1/1999 Ishibashi .................... 430/313

(Continued)

FOREIGN PATENT DOCUMENTS

CN 1199922 A 11/1998

(Continued)

OTHER PUBLICATIONS

European Search Report dated Jan. 29, 2004.

(Continued)

*Primary Examiner*—Sin Lee
(74) *Attorney, Agent, or Firm*—Westerman, Hattori, Daniels & Adrian, LLP.

(57) ABSTRACT

The present invention provides a resist pattern thickening material which can thicken a resist pattern to be thickened regardless of a material or a size thereof so as to form a fine space pattern, exceeding an exposure limit of exposure light. The resist pattern thickening material comprises: a resin; a crosslinking agent; and a nitrogen-containing compound. In a process for forming a resist pattern of the present invention, the resist pattern thickening material is applied on a surface of a resist pattern to be thickened, thereby forming a resist pattern. A process for manufacturing a semiconductor device of the present invention includes: applying the thickening material on a surface of a resist pattern to be thickened which is formed on an underlying layer, so as to thicken the resist pattern to be thickened and form a resist pattern; and patterning the underlying layer by etching using the resist pattern.

24 Claims, 16 Drawing Sheets

U.S. PATENT DOCUMENTS

| | | | |
|---|---|---|---|
| 6,048,637 A * | 4/2000 | Tsukahara et al. | 429/53 |
| 6,319,853 B1 | 11/2001 | Ishibashi | 438/780 |
| 6,329,119 B1 * | 12/2001 | Suetsugu et al. | 430/270.1 |
| 6,358,674 B1 | 3/2002 | Kamijima et al. | 430/311 |
| 6,416,939 B1 * | 7/2002 | Shimada et al. | 430/325 |
| 6,555,607 B1 | 4/2003 | Kanda et al. | |
| 6,579,657 B1 * | 6/2003 | Ishibashi et al. | 430/270.1 |
| 2002/0015909 A1 * | 2/2002 | Mizutani et al. | 430/270.1 |
| 2002/0028409 A1 * | 3/2002 | Yasunami et al. | 430/272.1 |
| 2003/0102285 A1 * | 6/2003 | Nozaki et al. | 216/41 |

FOREIGN PATENT DOCUMENTS

| | | |
|---|---|---|
| CN | 1221971 A | 7/1999 |
| CN | 1350205 A | 5/2002 |
| DE | 198 43 179 A1 | 7/1999 |
| DE | 100 14 083 A1 | 3/2001 |
| EP | 1 152 036 A1 | 7/2001 |
| EP | 1 223 470 A1 | 7/2002 |
| EP | 1 315 043 A1 | 11/2002 |
| EP | 1 343 052 A2 | 1/2003 |
| JP | 04178648 | 6/1992 |
| JP | 5-197151 | 8/1993 |
| JP | 06003824 | 1/1994 |
| JP | 07036187 | 7/1995 |
| JP | 10-73927 | 3/1998 |
| JP | 2000-347414 | 12/2000 |
| JP | 2001-19860 | 1/2001 |
| JP | 2001-228616 | 8/2001 |
| JP | 2002-6491 | 1/2002 |
| JP | 2002-49161 | 2/2002 |
| JP | 2002-60641 | 2/2002 |
| WO | WO 02/10858 A3 | 2/2002 |
| WO | WO 03/014830 A1 | 2/2003 |

OTHER PUBLICATIONS

Japanese Office Action dated Feb. 14, 2006 of a corresponding Japanese Application.

Japanese Office Action dated Jun. 6, 2006 of JP Application No. 2002-240082.

* cited by examiner crosslinking baking development with water

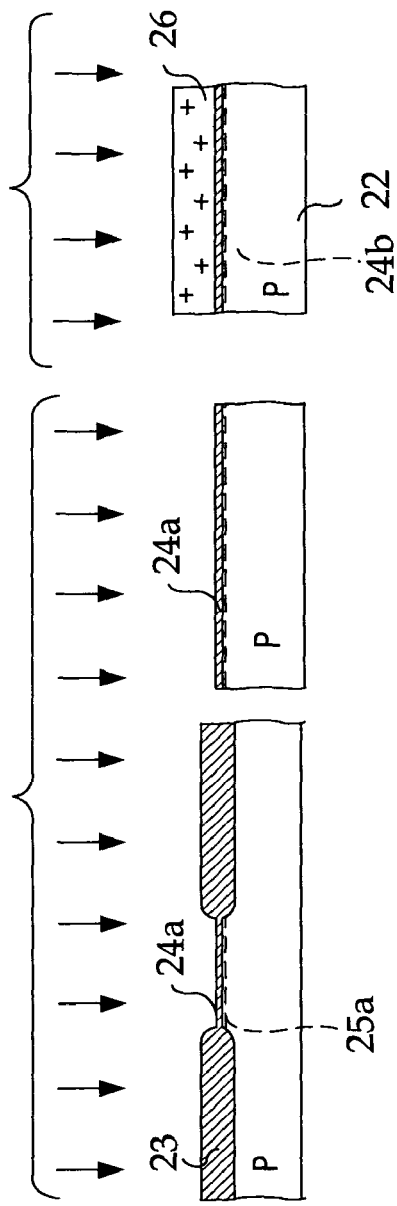
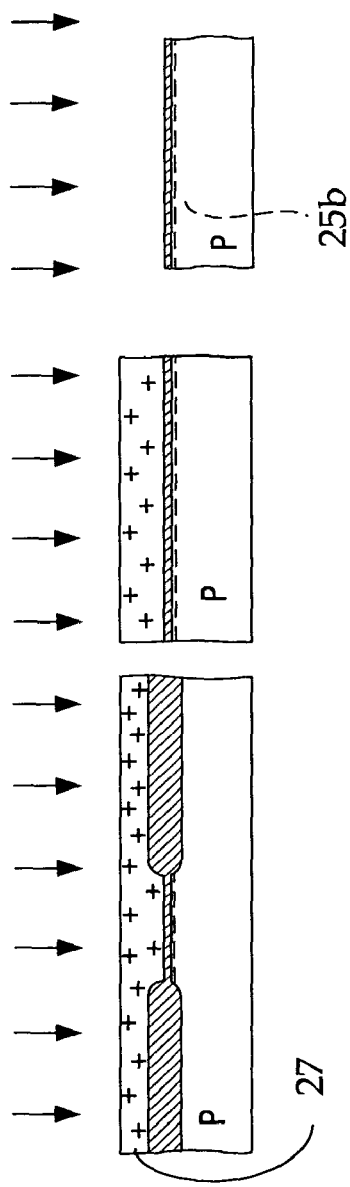
FIG. 7A
FIG. 7B
FIG. 7C

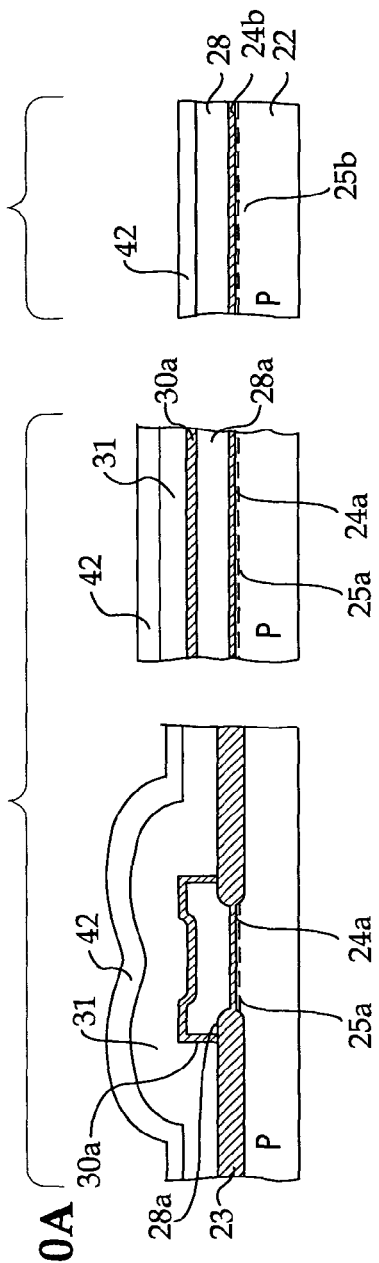
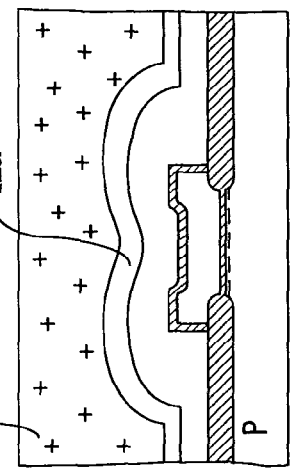
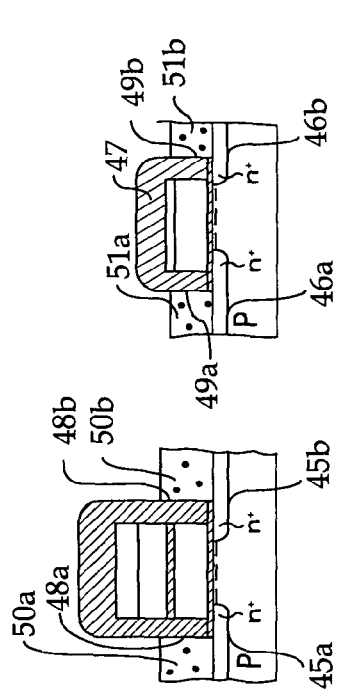
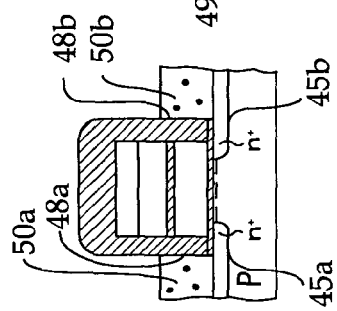
FIG. 10A
FIG. 10B
FIG. 10C

RESIST PATTERN THICKENING MATERIAL, PROCESS FOR FORMING RESIST PATTERN, AND PROCESS FOR MANUFACTURING SEMICONDUCTOR DEVICE

CROSS-REFERENCE TO RELATED APPLICATIONS

This application is based upon and claims the benefit of priority from the prior Japanese Patent Application No. 2002-240082, filed on Aug. 21, 2002, the entire contents of which are incorporated herein by reference.

BACKGROUND OF THE INVENTION

1. Field of the Invention

The present invention relates to a resist pattern thickening material, which is applied onto a resist pattern to be thickened and thickens the resist pattern to be thickened, and which can form a fine space pattern by exceeding exposure limits of light sources of existing exposure devices ("space pattern" is hereby defined as a hole, trench, recess, or any other empty space that is formed by a developed (removed) resist). The present invention also relates to a process for forming a resist pattern and a process for manufacturing a semiconductor device, which use the resist pattern thickening material.

2. Description of the Related Art

Semiconductor integrated circuits are becoming more highly integrated, and LSIs and VLSIs are being put into practical use. Accompanying this trend, the wiring patterns extend to regions of 0.2 µm or less, and the smallest patterns extend to regions of 0.1 µm or less. A lithographic technique is extremely important in forming fine wiring patterns. In the lithographic technique, a substrate, on which a thin film is formed, is covered by a resist film, is selectively exposed, and thereafter, is developed so as to form a resist pattern. Etching is carried out by using the resist pattern as a mask, and thereafter, by removing the resist pattern, the desired pattern is obtained.

In forming a fine wiring pattern, it is necessary to both make the light source of the exposure device be a short wavelength, and to newly develop resist materials which have high resolution and is suitable to the characteristics of the light source. However, in order to make a light source of an exposure device be a short wavelength, it is necessary to update the exposure device, which results in very high costs. Further, the development of new resist materials which is suitable to exposure using short wavelength light sources is not easy. Accordingly, the current situation is that there has not yet been provided a technique which can use light as the light source of an exposure device at the time of patterning, and which can form with high detail a uniform and fine space pattern.

SUMMARY OF THE INVENTION

An object of the present invention is to provide a process for forming a resist pattern which, when patterning a resist pattern to be thickened, can utilize, as is, light sources (such as ArF excimer laser light and the like) of existing exposure devices, and which has excellent mass productivity, and which can finely, uniformly, and stably form a space pattern having reduced surface roughness, exceeding the exposure limits of such light sources, regardless of the material and the size of the resist pattern to be thickened.

Another object of the present invention is to provide a resist pattern thickening material which, when applied on a resist pattern to be thickened, can efficiently, uniformly, and stably thicken the resist pattern to be thickened so that a thickened resist pattern has reduced surface roughness, regardless of the material and the size of the resist pattern to be thickened, and which is suitable for forming a fine space pattern, exceeding the exposure limits of light sources of existing exposure devices.

Yet another object of the present invention is to provide a process for manufacturing a semiconductor device which, by using a space pattern which has been formed to be fine and uniform using the resist pattern, can form a fine pattern on an underlying layer which is an oxide film or the like, and which can efficiently mass produce high-performance semiconductor devices having fine wiring and the like.

The resist pattern thickening material of the present invention comprises a resin, a crosslinking agent, and a nitrogen-containing compound. When the resist pattern thickening material is applied onto a resist pattern to be thickened, among the applied resist pattern thickened material, the portions thereof which are in a vicinity of the interface with the resist pattern to be thickened seep into the resist pattern to be thickened and crosslink with the material of the resist pattern to be thickened. At this time, because the affinity of the resist pattern thickening material and the resist pattern to be thickened is good, a surface layer, in which the resist pattern thickening material and the resist pattern to be thickened have become integral, is formed efficiently on the surface with the resist pattern to be thickened being the inner layer. (The resist pattern to be thickened is efficiently thickened by the resist pattern thickening material.) The resist pattern formed in this way (which will be called "thickened resist pattern" upon occasion hereinafter) is uniformly thickened by the resist pattern thickening material. Thus, a space pattern formed by the resist pattern exceeds exposure limits and has a more fine structure. Because the resist pattern thickening material of the present invention contains a nitrogen-containing compound, a good, uniform thickening effect is exhibited regardless of the type of the material, the size or the like of the resist pattern to be thickened, and there is little dependence on the material and the size of the resist pattern to be thickened. Further, even if free acids are generated while the resist pattern thickening material is being stored, the free acids are neutralized by the nitrogen-containing compound. Thus, the resist pattern thickening material is always maintained at a constant pH, and the storage stability thereof is excellent. The pH of the resist pattern thickening material does not decrease during storage, or due to the temperature conditions or the like. Therefore, stable thickening is always possible without being affected by the temperature conditions at the time of thickening, the storage conditions, or the like. The process margin can be ensured, and the roughness of the surface of the resist pattern can be decreased. Furthermore, the stable pH prevents the applied resist pattern thickening material from crosslinking throughout its entire portion.

The process for forming a resist pattern of the present invention comprises: applying the resist pattern thickening material of the present invention after forming a resist pattern to be thickened so as to cover a surface of the resist pattern to be thickened. In the process for forming a resist pattern of the present invention, after a resist pattern to be thickened has been formed, when the resist pattern thickening material is applied on the resist pattern to be thickened, among the applied resist pattern thickening material, the portions thereof which are in a vicinity of the interface with the resist pattern to be thickened seep into the resist pattern to be thickened and crosslink with the material of the resist pattern to be thickened. Thus, a surface layer, in which the resist pattern thickening material and the resist pattern to be thickened have become integral, is formed on the surface with the resist pattern to be thickened being the inner layer. The resist pattern formed in this way is uniformly thickened by the resist pattern thickening material. Thus, the space pattern formed by the resist pattern exceeds exposure limits and has a finer structure.

A process for forming a semiconductor device of the present invention comprises: applying the resist pattern thickening material of the present invention after forming a resist pattern to be thickened on an underlying layer so as to cover a surface of the resist pattern to be thickened, thereby thickening the resist pattern to be thickened and forming a resist pattern; and patterning the underlying layer by etching using the resist pattern. In the process for forming a semiconductor device of the present invention, after a resist pattern to be thickened has been formed on the underlying layer, the resist pattern thickening material is applied on the resist pattern to be thickened. Among the applied resist pattern thickening material, the portions thereof which are in a vicinity of the interface with the resist pattern to be thickened seep into the resist pattern to be thickened and crosslink with the material of the resist pattern to be thickened. Thus, a surface layer, in which the resist pattern thickening material and the resist pattern to be thickened have become integral, is formed on the surface with the resist pattern to be thickened being the inner layer. The resist pattern formed in this way is uniformly thickened by the resist pattern thickening material. Thus, the space pattern formed by the resist pattern exceeds exposure limits and has a finer structure. Then, the underlying layer is patterned by etching by using this pattern as a mask. Thus, a high-quality, high-performance semiconductor device having an extremely fine pattern can be manufactured efficiently.

BRIEF DESCRIPTION OF THE DRAWINGS

FIGS. 7A to 7C are part 1 of a set of cross-sectional schematic diagrams for explaining a process for manufacturing the FLASH EPROM which is an example of the process for manufacturing a semiconductor device of the present invention.

FIGS. 10A to 10C are cross-sectional schematic diagrams for explaining a process for manufacturing a FLASH EPROM which is another example of a process for manufacturing a semiconductor device of the present invention.

DESCRIPTION OF THE PREFERRED EMBODIMENTS

Resist Pattern Thickening Material

Figure 1A:
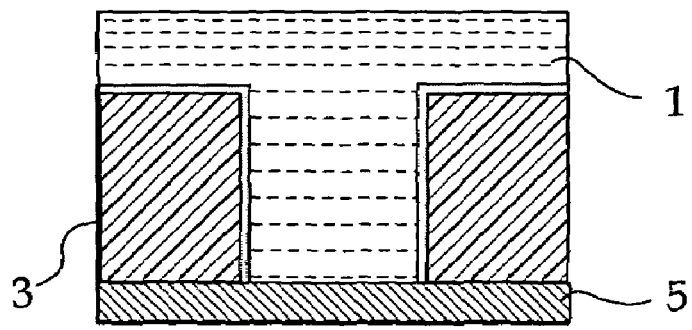
FIGS. 1A to 1C are schematic diagrams for explaining an example of the mechanism of thickening a resist pattern to be thickened (an inner layer resist pattern) by using a resist pattern thickening material of the present invention.

The resist pattern thickening material of the present invention comprises a resin, a crosslinking agent, and a nitrogen-containing compound. The resist pattern thickening material may contain, as needed, a surfactant, a water-soluble aromatic compound, a resin containing an aromatic compound in a portion thereof, an organic solvent, other components, and the like which are appropriately selected.

The resist pattern thickening material of the present invention is at least one of water-soluble and alkali-soluble.

The resist pattern thickening material of the present invention may be an aqueous solution, a colloid liquid, an emulsion liquid or the like, but an aqueous solution is preferable.

Resin

The resin is not particularly limited, and can be appropriately selected in accordance with the object. However, it is preferable that the resin is water-soluble or alkali-soluble. It is more preferable that the resin can generate a crosslinking reaction, or that the resin cannot generate a crosslinking reaction but can mix together with a water-soluble crosslinking agent.

When the resin is a water-soluble resin, the water-soluble resin preferably exhibits water solubility of 0.1 g or more thereof dissolving in 100 g of water of 25° C.

Examples of the water-soluble resin include polyvinyl alcohol, polyvinyl acetal, polyvinyl acetate, polyacrylic acid, polyvinyl pyrrolidone, polyethylene imine, polyethylene oxide, styrene-maleic acid copolymer, polyvinyl amine, polyallylamine, oxazoline group containing water-soluble resins, water-soluble melamine resins, water-soluble urea resins, alkyd resins, sulfonamide resins, and the like.

When the resin is an alkali-soluble resin, the alkali-soluble resin preferably exhibits alkali solubility of 0.1 g or more thereof dissolving in 100 g of 2.38% tetramethyl ammonium hydroxide (TMAH) aqueous solution of 25° C.

Examples of the alkali-soluble resin are novolak resins, vinylphenol resins, polyacrylic acid, polymethacrylic acid, poly p-hydroxyphenylacrylate, poly p-hydroxyphenylmethacrylate, copolymers thereof, and the like.

These may be used singly, or in combination of two or more. Among these, polyvinyl alcohol, polyvinyl acetal, polyvinyl acetate, and the like are preferable.

The content of the resin in the resist pattern thickening material differs in accordance with the type, the content and the like of the crosslinking agent, the nitrogen-containing compound and the like, and cannot be stipulated unconditionally, and can be appropriately selected in accordance with the object.

Crosslinking Agent

The crosslinking agent is not particularly limited, and can be appropriately selected in accordance with the object. However, water-soluble crosslinking agents which cause crosslinking due to heat or an acid are preferable. Amino crosslinking agents are suitable examples.

Suitable examples of the amino crosslinking agents are melamine derivatives, urea derivatives, uril derivatives, and the like. These may be used singly, or in combination of two or more.

Examples of the urea derivatives include urea, alkoxymethylene urea, N-alkoxymethylene urea, ethylene urea, ethylene urea carboxylic acid, derivatives thereof, and the like.

Examples of the melamine derivatives include alkoxymethyl melamine, derivatives thereof, and the like.

Examples of the uril derivatives include benzoguanamine, glycol uril, derivatives thereof, and the like.

The content of the crosslinking agent in the resist pattern thickening material differs in accordance with the type, the content and the like of the resin, the nitrogen-containing compound and the like, and cannot be stipulated unconditionally, and can be appropriately selected in accordance with the object.

Nitrogen-Containing Compound

The nitrogen-containing compound is not particularly limited, and can be appropriately selected in accordance with the object. Suitably examples thereof are organic substances, and thereamong, those which are basic are preferable.

When the resist pattern thickening material contains the nitrogen-containing compound, a good, uniform thickening effect is exhibited regardless of the type of the material of the resist pattern to be thickened. This is advantageous in that there is little dependence on the material of the resist pattern to be thickened, and the edge roughness of the obtained resist pattern is improved.

Specific examples of the nitrogen-containing compound are amines, amides, imides, quaternary ammonium salts, derivatives thereof, and the like. These may be used singly, or in combination of two or more.

The amines are not particularly limited and can be appropriately selected in accordance with the object. Examples thereof include chain and cyclic amines such as hexylamine, heptylamine, octylamine, nonylamine, decylamine, aniline, 2-, 3-, or 4-methylaniline, 4-nitroaniline, 1- or 2-naphthylamine, ethylene diamine, tetramethylene diamine, hexamethylene diamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, tris[2-(2-methoxyethoxy)ethyl]amine, triisopropanolamine, N,N-dimethylaniline, imidazole, pyridine, 4-methylpyridine, 4-methylimidazole, bipyridine, 2,2'-dipyridylamine, di-2-pyridylketone, 1,2-di(2-pyridyl)ethane, 1,2-di(4-pyridyl)ethane, 1,3-di(4-pyridyl)propane, 1,2-di(2-pyridyl)ethylene, 1,2-di(4-pyridyl)ethylene, 1,2-bis(4-pyridyloxy)ethane, 4,4'-dipyridylsulfide, 2,2'-dipicolylamine, 3,3'-dipicolylamine, and the like.

The amides are not particularly limited, and can be appropriately selected in accordance with the object. Examples thereof include pentano-4-lactam, 5-methyl-2-pyrrolidinone, $\epsilon$-caprolactam, and the like.

The imides are not particularly limited and can be appropriately selected in accordance with the object. Examples thereof include phthalimide, cyclohexa-3-en-1,2-dicarboxyimide and the like.

The quaternary ammonium salts are not particularly limited, and can be appropriately selected in accordance with the object. Examples thereof include tetraisopropyl ammonium hydroxide, tetrabutyl ammonium hydroxide, and the like.

The content of the nitrogen-containing compound in the resist pattern thickening material differs in accordance with the resin, the crosslinking agent and the like, and cannot be stipulated unconditionally, and can be appropriately selected in accordance with the type, the content, and the like.

Surfactant

The surfactant is not particularly limited and can be appropriately selected in accordance with the object. Examples of the surfactant include non-ionic surfactants, cationic surfactants, anionic surfactants, amphoteric surfactants, and the like. These may be used singly, or in combination of two or more. Among these, non-ionic surfactants are preferable from the standpoint that they do not contain metal ions.

Suitable examples of the non-ionic surfactants include surfactants selected from among alkoxylate surfactants, fatty acid ester surfactants, amide surfactants, alcohol surfactants, and ethylene diamine surfactants. Specific examples thereof include polyoxyethylene-polyoxypropylene condensation products, polyoxyalkylene alkylether compounds, polyoxyethylene alkylether compounds, polyoxyethylene derivatives, sorbitan fatty acid ester compounds, glycerin fatty acid ester compounds, primary alcohol ethoxylate compounds, phenol ethoxylate compounds, nonylphenol ethoxylate surfactants, octylphenol ethoxylate surfactants, lauryl alcohol ethoxylate surfactants, oleyl alcohol ethoxylate surfactants, fatty acid ester surfactants, amide surfactants, natural alcohol surfactants, ethylene diamine surfactants, secondary alcohol ethoxylate surfactants, and the like.

The cationic surfactants are not particularly limited and can be appropriately selected in accordance with the object. Examples thereof include alkyl cationic surfactants, amide quaternary cationic surfactants, ester quaternary cationic surfactants, and the like.

The amphoteric surfactants are not particularly limited and can be appropriately selected in accordance with the object. Examples thereof include amine oxide surfactants, betaine surfactants, and the like.

The content of the surfactant in the resist pattern thickening material differs in accordance with the type, the content, and the like of the resin, the crosslinking agent, the nitrogen-containing compound and the like, and cannot be stipulated unconditionally, and can be appropriately selected in accordance with the object.

Water-Soluble Aromatic Compound

From the standpoint of markedly improving the etching resistance of the obtained resist pattern, the resist pattern thickening material preferably contains a water-soluble aromatic compound.

The water-soluble aromatic compound is not particularly limited provided that it is an aromatic compound and exhibits water solubility, and can be appropriately selected in accordance with the object. However, water-soluble aromatic compounds exhibiting water solubility of 1 g or more thereof dissolving in 100 g of water of 25° C. are preferable, those exhibiting water solubility of 3 g or more thereof dissolving in 100 g of water of 25° C. are more preferable, and those exhibiting water solubility of 5 g or more thereof dissolving in 100 g of water of 25° C. are particularly preferable.

Examples of the water-soluble aromatic compound are polyphenol compounds, aromatic carboxylic acid compounds, naphthalene polyhydroxyl compounds, benzophenone compounds, flavonoid compounds, porphin, water-soluble phenoxy resins, aromatic-containing water-soluble dyes, derivatives thereof, glycosides thereof, and the like. These may be used singly, or in combination of two or more.

Examples of the polyphenol compounds and derivatives thereof include catechin, anthocyanidin (pelargonidin-type (4'-hydroxy), cyanidin-type (3',4'-dihydroxy), delphinidin-type (3',4',5'-trihydroxy)), flavan-3,4-diol, proanthocyanidin, resorcinol, resorcinol [4] arene, pyrogallol, gallic acid, derivatives and glycosides thereof, and the like.

Examples of the aromatic carboxylic acid compounds and derivatives thereof include salicylic acid, phthalic acid, dihydroxy benzoic acid, tannin, derivatives and glycosides thereof, and the like.

Examples of the naphthalene polyhydroxyl compounds and derivatives thereof include naphthalene diol, naphthalene triol, derivatives and glycosides thereof, and the like.

Examples of the benzophenone compounds and derivatives thereof include alizarin yellow A, derivatives and glycosides thereof, and the like.

Examples of the flavonoid compounds and derivatives thereof include flavone, isoflavone, flavanol, flavonone, flavonol, flavan-3-ol, aurone, chalcone, dihydrochalcone, quercetin, derivatives and glycosides thereof, and the like.

Among the aforementioned water-soluble aromatic compounds, from the standpoint of excellent water solubility, those having two or more polar groups are preferable, those having three or more polar groups are more preferable, and those having four or more polar groups are particularly preferable.

The polar groups are not particularly limited, and may be appropriately selected in accordance with the object. Examples thereof include a hydroxyl group, a carboxyl group, a carbonyl group, a sulfonyl group, and the like.

The content of the water-soluble aromatic compound in the resist pattern thickening material can be appropriately determined in accordance with the type, the content, and the like of the resin, the crosslinking agent, the nitrogen-containing compound, and the like.

Resin Containing an Aromatic Compound in a Portion Thereof

From the standpoint of markedly improving the etching resistance of the obtained resist pattern, it is preferable that the resist pattern thickening material contains a resin containing an aromatic compound in a portion thereof.

The resin containing an aromatic compound in a portion thereof is not particularly limited and can be appropriately selected in accordance with the object. However, those which can generate a crosslinking reaction are preferable. Suitable examples thereof include polyvinyl aryl acetal resins, polyvinyl aryl ether resins, polyvinyl aryl ester resins, and derivatives thereof. It is preferable to use at least one type selected therefrom. From the standpoint of exhibiting water solubility or alkali solubility to an appropriate degree, such a resin which contains an acetyl group is more preferable. These may be used singly, or in combination of two or more.

The polyvinyl aryl acetal resins are not particularly limited and may be appropriately selected in accordance with the object. Examples thereof include β-resorcinol acetal and the like.

The polyvinyl aryl ether resins are not particularly limited and may be appropriately selected in accordance with the object. Examples thereof include 4-hydroxybenzyl ether and the like.

The polyvinyl aryl ester resins are not particularly limited and may be appropriately selected in accordance with the object. Examples thereof include benzoate and the like.

The method of producing the polyvinyl aryl acetal resins is not particularly limited and may be appropriately selected in accordance with the object. A suitable example thereof is a known method of producing using a polyvinyl acetal reaction, or the like. Such a producing method is a method in which, for example, polyvinyl alcohol, and aldehyde in an amount needed stoichiometrically for the polyvinyl alcohol are made to undergo an acetalizing reaction in the presence of an acid catalyst. Specifically, suitable examples are the methods disclosed in U.S. Pat. Nos. 5,169,897 and 5,262,270, Japanese Patent Application Laid-Open (JP-A) No. 5-78414, and the like.

The method of producing the polyvinyl aryl ether resins is not particularly limited and may be appropriately selected in accordance with the object. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction of Williamson); and the like. Specifically, suitable examples are the methods disclosed in JP-A Nos. 2001-40086, 2001-181383, 6-116194, and the like.

The method of producing the polyvinyl aryl ester resins is not particularly limited and may be appropriately selected in accordance with the object. Examples thereof are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The aromatic compound in the resin containing an aromatic compound in a portion thereof is not particularly limited, and may be appropriately selected in accordance with the object. Suitable examples thereof include monocyclic aromatic compounds such as benzene derivatives, pyridine derivatives, and the like, and compounds in which a plurality of aromatic rings are connected (polycyclic aromatic compounds such as naphthalene, anthracene, and the like), and the like.

From the standpoint of appropriate water solubility, the aromatic compound in the resin containing an aromatic compound in a portion thereof preferably contains at least one of a functional group such as a hydroxyl group, a cyano group, an alkoxyl group, a carboxyl group, an amino group, an amide group, an alkoxycarbonyl group, a hydroxyalkyl group, a sulfonyl group, an acid anhydride group, a lactone group, a cyanate group, an isocyanate group, a ketone group or the like, or a sugar derivative. It is more preferable for the aromatic compound to contain at least one functional group selected from a hydroxyl group, an amino group, a sulfonyl group, a carboxyl group, and groups formed by derivatives thereof.

The molar percentage content of the aromatic compound in the resin containing an aromatic compound in a portion thereof is not particularly limited provided that it does not affect the etching resistance, and can be appropriately selected in accordance with the object. However, when high etching resistance is required, the molar percentage content is preferably 5% by mol or more, and more preferably 10% by mol.

It should be noted that the molar percentage content of the aromatic compound in the resin containing an aromatic compound in a portion thereof can be measured by using NMR or the like for example.

The content, in the resist pattern thickening material, of the resin containing an aromatic compound in a portion thereof, can be appropriately determined in accordance with the type, the content and the like of the resin, the crosslinking agent, the nitrogen-containing compound and the like.

Organic Solvent

By making the resist pattern thickening material contain an organic solvent, the solubility of the resin, the crosslinking agent, the nitrogen-containing compound and the like in the resist pattern thickening material can be improved.

The organic solvent is not particularly limited, and can be appropriately selected in accordance with the object. Examples include alcohols, chain esters, cyclic esters, ketones, chain ethers, cyclic ethers and the like.

Examples of the alcohols are methanol, ethanol, propyl alcohol, isopropyl alcohol, butyl alcohol, and the like.

Examples of the chain esters are ethyl lactate, propylene glycol methyl ether acetate (PGMEA), and the like.

Examples of the cyclic esters are lactones such as γ-butyrolactone, and the like.

Examples of the ketones are such as acetone, cyclohexanone, heptanone, and the like.

Examples of the chain ethers are ethylene glycol dimethylether, and the like.

Examples of the cyclic ethers are tetrahydrofuran, dioxane, and the like.

These may be used singly, or in combination of two or more. Thereamong, organic solvents having a boiling point of around 80° C. to 200° C. are preferable from the standpoint of carrying out thickening accurately.

The content of the organic solvent in the resist pattern thickening material can be appropriately determined in accordance with the type, the content, and the like of the resin, the crosslinking agent, the nitrogen-containing compound, the surfactant, and the like.

Other Components

The other components are not particularly limited provided that they do not adversely affect the effects of the present invention, and can be appropriately selected in accordance with the object.

The content of the other components in the resist pattern thickening material can be appropriately determined in accordance with the type, the content and the like of the resin, the crosslinking agent, the nitrogen-containing compound, and the like.

Use

The resist pattern thickening material of the present invention can be used by being applied onto a resist pattern to be thickened.

At the time of applying, the surfactant may be applied before and separately from applying of the resist pattern thickening material, without being contained in the resist pattern thickening material.

When the resist pattern thickening material is applied on and crosslinks with the resist pattern to be thickened, the resist pattern to be thickened thickens. A surface layer is formed on the resist pattern to be thickened, so that a resist pattern is formed.

At this time, because the nitrogen-containing compound is contained in the resist pattern thickening material, the resist pattern to be thickened thickens stably, without being affected by the temperature conditions at the time of thickening the resist pattern to be thickened, the storage conditions of the resist pattern thickening material, and the like. Further, the resist pattern is obtained in a uniform state (i.e., a state in which the edge roughness thereof is improved), in which the pattern size is not dependent on the material of the resist pattern to be thickened.

The diameter or width of the space pattern formed by the resist pattern obtained in this way is smaller than the diameter or width of a space pattern formed by the initial resist pattern (the resist pattern to be thickened). The exposure limit of the light source of the exposure device used at the time of patterning the resist pattern to be thickened is exceeded, so that an even finer space pattern is formed. For example, in a case in which ArF excimer laser light is used at the time of patterning the resist pattern to be thickened, when a resist pattern is formed by thickening the obtained resist pattern to be thickened by using the resist pattern thickening material of the present invention, the space pattern formed by the resist pattern is a fine space pattern which is comparable to that obtained when patterned by an electron beam.

It should be noted that, at this time, the amount of thickening of the resist pattern to be thickened can be controlled to a desired range by appropriately adjusting the viscosity of the resist pattern thickening material, the applied thickness of the resist pattern thickening material, the baking temperature, the baking time, and the like.

Material of Resist Pattern to be Thickened

The material of the resist pattern to be thickened (the resist pattern on which the resist pattern thickening material of the present invention is applied) is not particularly limited, and can be appropriately selected from among known resist materials in accordance with the object. The material of the resist pattern to be thickened may be either of a negative type or a positive type resist material. Suitable examples thereof include g-line resists, i-line resists, KrF resists, ArF resists, $F_2$ resists, electron beam resists, and the like, which can be patterned by g-line, i-line, KrF excimer lasers, ArF excimer lasers, $F_2$ excimer lasers, electron beams, and the like, respectively. These resists may be chemically amplified types, or non-chemically amplified types. Among these, KrF resists, ArF resists, and the like are preferable, and ArF resists are more preferable.

Specific examples of the material of the resist pattern to be thickened are novolak resists, PHS resists, acrylic resists, cycloolefin-maleic acid anhydride (COMA) resists, cycloolefin resists, hybrid (alicyclic acryl—COMA copolymer) resists, and the like. These materials may be fluorine-modified or the like.

The process of forming the resist pattern to be thickened, and the size, the thickness and the like of the resist pattern to be thickened are not particularly limited, and can be appropriately selected in accordance with the object. In particular, the thickness can be appropriately determined by the underlying layer which is the object of working, the etching conditions, and the like. However, the thickness is generally about 0.1 μm to about 200 μm.

The thickening of the resist pattern to be thickened by using the resist pattern thickening material of the present invention will be described hereinafter with reference to the drawings.

Figure 1B:
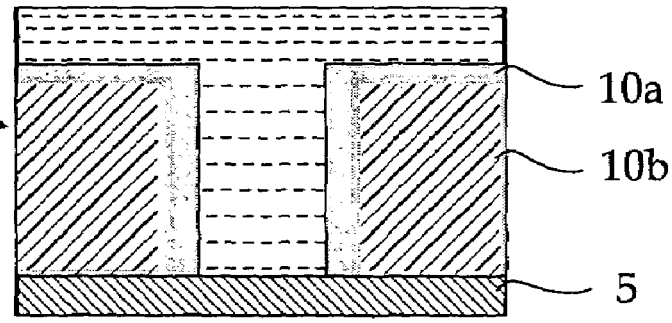

As shown in FIG. 1A, after an initial resist pattern (resist pattern to be thickened) 3 has been formed on an underlying layer (base) 5, a resist pattern thickening material 1 is applied on the surface of the resist pattern to be thickened 3. Prebaking (heating and drying) is carried out, so that a applied film is formed. Then, as shown in FIG. 1B, mixing (impregnation) of the resist pattern thickening material 1 into the resist pattern to be thickened 3 occurs at the interface between the resist pattern to be thickened 3 and the resist pattern thickening material 1. The mixed (impregnated) portion at the interface of an inner layer resist pattern 10b (the resist pattern to be thickened 3) and the resist pattern thickening material 1 crosslinks, and a surface layer 10a is formed. At this time, because the nitrogen-containing compound is contained in the resist pattern thickening material 1, the inner layer resist pattern 10b (the resist pattern to be thickened 3) is stably thickened without being affected by the temperature conditions at the time of thickening the inner layer resist pattern 10b (the resist pattern to be thickened 3), or by the storage conditions of the resist pattern thickening material 1, or the like.

Figure 1C:
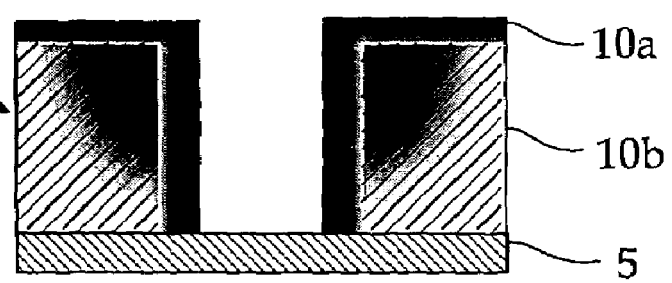

Thereafter, as shown in FIG. 1C, by carrying out developing processing, the portions, among the applied resist pattern thickening material 1, which have not crosslinked with the resist pattern to be thickened 3 or at which the crosslinking is weak (portions having high water solubility) are dissolved and removed. A resist pattern 10, which has been uniformly thickened in a state in which the edge roughness thereof has been improved, is formed (developed).

The developing processing may be water developing or developing by using an alkali developing liquid.

The resist pattern 10 has, on the surface of the inner side resist pattern 10b (the resist pattern to be thickened 3), the surface layer 10a which has been formed by the resist pattern thickening material 1 crosslinking. The resist pattern 10 is thicker than the resist pattern to be thickened 3 by an amount corresponding to the thickness of the surface layer 10a. Thus, the width of the space pattern formed by the resist pattern 10 is smaller than the width of a space pattern formed by the resist pattern to be thickened 3. Thus, the exposure limit of the light source of an exposure device at the time when the resist pattern to be thickened 3 is formed is exceeded, so that the space pattern can be formed to be fine. The space pattern formed by the resist pattern 10 is finer than a space pattern formed by a resist pattern to be thickened 3.

The surface layer 10a of the resist pattern 10 is formed by the resist pattern thickening material 1. In a case in which the resist pattern thickening material 1 contains at least one of an aromatic compound and a resin containing an aromatic compound in a portion thereof, even if the resist pattern to be thickened 3 (the inner layer resist pattern 10b) is a material which has poor etching resistance, the obtained resist pattern 10 has, on the surface thereof, the surface layer 10a which contains at least one of an aromatic compound and a resin containing an aromatic compound in a portion thereof. Therefore, the etching resistance is markedly excellent.

Applications

The resist pattern thickening material of the present invention can suitably be used in thickening a resist pattern to be thickened, and making a space pattern fine, exceeding exposure limits. The resist pattern thickening material of the present invention is particularly suitably used in the process for manufacturing a semiconductor device of the present invention.

When the resist pattern thickening material of the present invention contains at least one of an aromatic compound and a resin containing an aromatic compound in a portion thereof, the resist pattern thickening material can suitably be used in covering and thickening patterns which are exposed to plasma or the like and which are formed of resin or the like whose surface etching resistance must be improved, and can more suitably be used in cases in which at least one of an aromatic compound and a resin containing an aromatic compound in a portion thereof cannot be used as the material of the pattern.

Process for Forming Resist Pattern

In the process for forming a resist pattern of the present invention, after the resist pattern to be thickened is formed, the resist pattern thickening material of the present invention is applied so as to cover the surface of the resist pattern to be thickened.

Suitable examples of materials of the resist pattern to be thickened are the materials which were listed above in the discussion of the resist pattern thickening material of the present invention.

The resist pattern to be thickened can be formed in accordance with known methods.

The resist pattern to be thickened can be formed on an underlying layer (a base). The underlying layer (base) is not particularly limited, and can be appropriately selected in accordance with the object. However, when the resist pattern is formed into a semiconductor device, the underlying layer (base) is usually a substrate such as a silicon wafer, or any of various types of oxide films, or the like.

The method of applying the resist pattern thickening material is not particularly limited, and can be appropriately selected from among known coating methods in accordance with the object. Suitable examples thereof are a spin coating method and the like. In the case in which a spin coating method is used, the conditions are as follows for example: the rotational speed is about 100 rpm to about 10,000 rpm, and is preferably 800 rpm to 5,000 rpm, and the time is about one second to about 10 minutes, and one second to 90 seconds is preferable.

The applied thickness at the time of applying is usually about 10 nm (100 Å) to about 1,000 nm (10,000 Å), and about 200 nm (2,000 Å) to 500 nm (5,000 Å) is preferable.

It should be noted that, at the time of coating, the surfactant may be applied before and separately from applying of the resist pattern thickening material, without being contained in the resist pattern thickening material.

Carrying out prebaking (heating and drying) of the applied resist pattern thickening material during applying or after applying is preferable from the standpoint that the resist pattern thickening material can be efficiently mixed (impregnated) into the resist pattern to be thickened at the interface between the resist pattern to be thickened and the resist pattern thickening material.

The conditions, the method and the like of the prebaking (heating and drying) are not particularly limited and can be appropriately selected in accordance with the object, provided that they do not cause softening of the resist pattern. For example, the temperature is about 40° C. to about 120° C., and preferably 70° C. to 100° C., and the time is about 10 seconds to 5 minutes, and preferably 40 seconds to 100 seconds.

Carrying out crosslinking baking (a crosslinking reaction) of the applied resist pattern thickening material after the prebaking (heating and drying) is preferable from the standpoint that the crosslinking reaction of the mixed (impregnated) portion at the interface between the resist pattern to be thickened and the resist pattern thickening material can be made to proceed efficiently.

The conditions, the method and the like of the crosslinking baking (the crosslinking reaction) are not particularly limited and can be appropriately selected in accordance with the object. However, usually, a temperature higher than that during the prebaking (heating and drying) is used. The conditions of the crosslinking baking (the crosslinking reaction) are, for example, the temperature is about 70° C. to about 150° C., and 90° C. to 130° C. is preferable, and the time is about 10 seconds to about 5 minutes, and 40 seconds to 100 seconds is preferable.

Carrying out developing processing of the applied resist pattern thickening material after the crosslinking baking (the crosslinking reaction) is preferable. This is preferable from the standpoint that, among the applied resist pattern thickening material, the portions thereof which have not crosslinked with the resist pattern to be thickened and the portions thereof at which the crosslinking is weak (the portions having high water solubility) are dissolved and removed, and the resist pattern can be developed (obtained).

The same comments as those above regarding developing processing are applicable here as well.

The process for forming a resist pattern of the present invention will be described hereinafter with reference to the drawings.

Figure 2A:
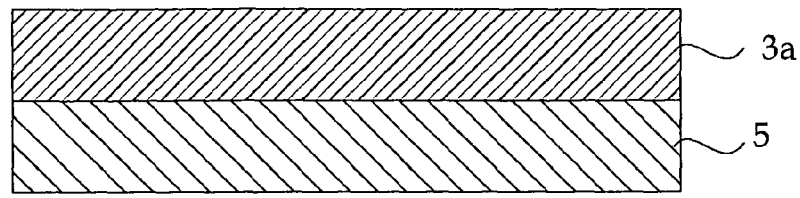
FIGS. 2A to 2E are schematic diagrams for explaining an example of a process for forming a resist pattern of the present invention.
Figure 2B:
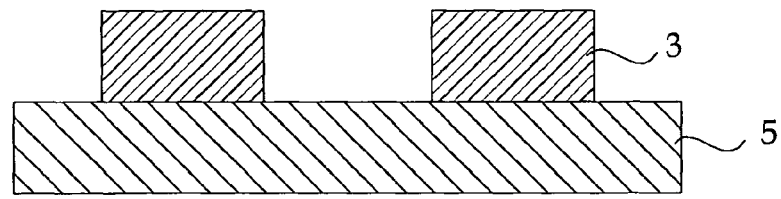
Figure 2C:
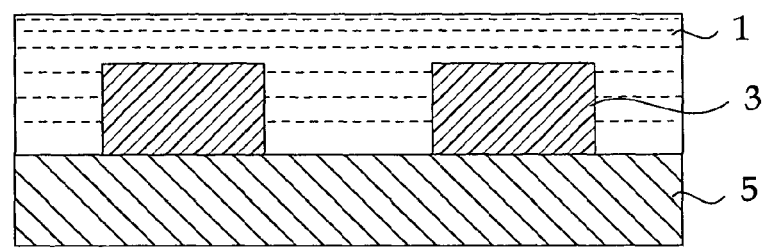
Figure 2D:
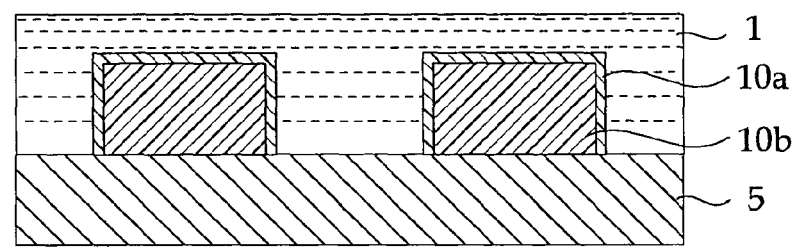
Figure 2E:
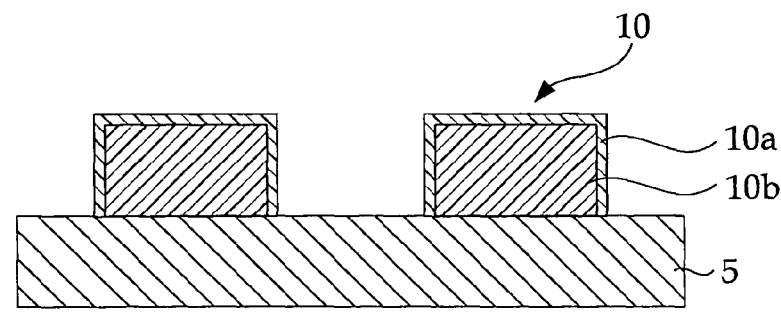

As shown in FIG. 2A, after a resist material 3a is applied onto the underlying layer (base) 5, as shown in FIG. 2B, the resist material 3a is patterned so that the resist pattern to be thickened 3 is formed. Thereafter, as shown in FIG. 2C, the resist pattern thickening material 1 is applied onto the surface of the resist pattern to be thickened 3, and prebaking (heating and drying) is carried out so that a film is formed. Then, mixing (impregnating) of the resist pattern thickening material 1 into the resist pattern to be thickened 3 takes place at the interface between the resist pattern to be thickened 3 and the resist pattern thickening material 1. As shown in FIG. 2D, the mixed (impregnated) portion at the interface of the resist pattern to be thickened 3 and the resist pattern thickening material 1 crosslinks. Thereafter, as shown in FIG. 2E, by carrying out developing processing, among the applied resist pattern thickening material 1, the portions thereof which have not crosslinked with the resist pattern to be thickened 3 and the portions thereof at which the crosslinking is weak (the portions having high water solubility) are dissolved and removed, so that the resist pattern 10 having the surface layer 10a on the inner layer resist pattern 10b (the resist pattern to be thickened 3) is formed (developed).

The developing processing may be water developing or developing by using a weak alkali aqueous solution. However, water developing is preferable from the standpoint that the developing processing can be carried out efficiently at a low cost.

The resist pattern 10 has, on the surface of the inner layer resist pattern 10b (the resist pattern to be thickened 3), the surface layer 10a which has been formed by the resist pattern thickening material 1 crosslinking. The resist pattern 10 is thicker than the resist pattern to be thickened 3 (the inner layer resist pattern 10b) by an amount corresponding to the thickness of the surface layer 10a. Thus, the width of a space pattern formed by the resist pattern 10 is smaller than the width of a space pattern formed by the resist pattern to be thickened 3 (the inner layer resist pattern 10b), and the space pattern formed by the resist pattern 10 is fine.

The surface layer 10a of the resist pattern 10 is formed by the resist pattern thickening material 1. In a case in which the resist pattern thickening material 1 contains at least one of an aromatic compound and a resin containing an aromatic compound in a portion thereof, the etching resistance is markedly excellent. In this case, even if the resist pattern to be thickened 3 (the inner layer resist pattern 10b) is a material which has poor etching resistance, the resist pattern 10, which has on the surface thereof the surface layer 10a having excellent etching resistance, can be formed.

The resist pattern which is formed by the process for forming a resist pattern of the present invention has, on the surface of the resist pattern to be thickened, the surface layer which is formed by the resist pattern thickening material of the present invention crosslinking. When the resist pattern thickening material contains at least one of an aromatic compound and a resin containing an aromatic compound in a portion thereof, even if the resist pattern to be thickened is a material having poor etching resistance, the resist pattern, which has the surface layer having excellent etching resistance on the surface of the resist pattern to be thickened, can be efficiently be formed. Further, the resist pattern, which is formed by the process for forming a resist pattern of the present invention, is thicker than the resist pattern to be thickened by an amount corresponding to the thickness of the surface layer. Therefore, the width of a space pattern formed by the formed, resist pattern 10 is smaller than the width of a space pattern formed by the resist pattern to be thickened. Therefore, in accordance with the process for forming a resist pattern of the present invention, a fine space pattern can be formed efficiently.

The resist pattern formed by the resist pattern thickening material of the present invention has, on the resist pattern to be thickened, the surface layer which is formed by the resist pattern thickening material of the present invention.

The resist pattern preferably has excellent etching resistance. It is preferable that the etching speed (nm/s) of the resist pattern is equivalent to or smaller than that of the resist pattern to be thickened. Specifically, when measurement is carried out under the same conditions, the ratio (resist pattern to be thickened/surface layer) of the etching speed (nm/s) of the surface layer and the etching speed (nm/s) of the resist pattern to be thickened is preferably 1.1 or more, and is more preferably 1.2 or more, and is particularly preferably 1.3 or more.

The etching speed (nm/s) can be measured by, for example, carrying out etching processing for a predetermined time by using a known etching device, measuring the amount of film reduction of the sample, and calculating the amount of film reduction per unit time.

The surface layer can suitably be formed by using the resist pattern thickening material of the present invention. From the standpoint of improving the etching resistance, the surface layer preferably contains at least one of an aromatic compound and a resin containing an aromatic compound in a portion thereof.

Whether the surface layer does or does not contain at least one of the aromatic compound and the resin containing an aromatic compound in a portion thereof, can be confirmed by, for example, analyzing the IR absorption spectrum of the surface layer.

The resist pattern may contain at least one of an aromatic compound and a resin containing an aromatic compound in a portion thereof. In this case, the content of the at least one of the aromatic compound and the resin containing an aromatic compound in a portion thereof can be set so as to gradually decrease from the surface layer toward the interior.

In the resist pattern, the border between the resist pattern to be thickened and the surface layer may be a clear structure, or may be an unclear structure.

The resist pattern formed by the process for forming a resist pattern of the present invention can suitably be used in, for example, the formation of functional parts such as mask patterns, reticle patterns, recording heads, LCDs (liquid crystal displays), PDPs (plasma display panels), SAW filters (surface acoustic wave filters), and the like; optical parts used in connecting optical wiring; fine parts such as microactuators and the like; semiconductor devices; and the like. The resist pattern can be suitably used in the process for manufacturing a semiconductor device of the present invention, which will be described hereinafter.

Semiconductor Device and Process for Manufacturing Semiconductor Device

The process for manufacturing a semiconductor device of the present invention comprises applying a resist pattern thickening material and patterning. The process may include other steps which are appropriately selected as needed.

The process includes applying the resist pattern thickening material of the present invention after forming a resist pattern to be thickened on an underlying layer so as to cover a surface of the resist pattern to be thickened, thereby thickening the resist pattern to be thickened and forming a resist pattern. Details of the application and forming are the same as those of the process for forming a resist pattern of the present invention.

Examples of the underlying layer are surface layers of various members in semiconductor devices. Suitable examples are substrates such as silicon wafers, surface layers thereof, various types of oxide films, and the like. The resist pattern to be thickened is as described above. The method of applying is as described above. Further, after the application, it is preferable to carry out the above-described prebaking, crosslinking baking, and the like.

The process further includes patterning the underlying layer by carrying out etching by using (as a mask pattern or the like) the resist pattern formed by applying the resist pattern thickening material.

The method of etching is not particularly limited, and can be appropriately selected from among known methods in accordance with the object. Dry etching is a suitable example. The etching conditions are not particularly limited, and can be appropriately selected in accordance with the object.

Suitable examples of other steps are a surfactant applying step, a developing processing step, and the like.

In the surfactant applying step, a surfactant is applied on the surface of the resist pattern to be thickened, before applying the resist pattern thickening material.

The surfactant is not particularly limited, and can be appropriately selected in accordance with the object. Suitable examples thereof are the surfactants listed above, including polyoxyethylene-polyoxypropylene condensation products, polyoxyalkylene alkylether compounds, polyoxyethylene alkylether compounds, polyoxyethylene derivative compounds, sorbitan fatty acid ester compounds, glycerin fatty acid ester compounds, primary alcohol ethoxylate compounds, phenol ethoxylate compounds, and nonylphenol ethoxylate surfactants, octylphenol ethoxylate surfactants, lauryl alcohol ethoxylate surfactants, oleyl alcohol ethoxylate surfactants, fatty acid ester surfactants, amide surfactants, natural alcohol surfactants, ethylene diamine surfactants, secondary alcohol ethoxylate surfactants, alkyl cationic surfactants, amide quaternary cationic surfactants, ester quaternary cationic surfactants, amine oxide surfactants, and betaine surfactants, and the like.

In the developing processing step, the applied resist pattern thickening material is developed, after applying the resist pattern thickening material and before patterning. It should be noted that the developing processing is as described previously.

In accordance with the process for manufacturing a semiconductor device of the present invention, it is possible to efficiently manufacture various types of semiconductor devices such as flash memories, DRAMs, FRAMs, and the like.

Hereinafter, Examples of the present invention will be concretely described. However, the present invention is not in any way limited to these Examples.

EXAMPLE 1

Preparation of Resist Pattern Thickening Material

Resist pattern thickening materials A through F of the present invention having the compositions shown in Table 1 were prepared. Note that, in Table 1, the unit of the values in parentheses is parts by mass. In the "resin" column, "KW-3" is a polyvinyl acetal resin (manufactured by Sekisui Chemical Co., Ltd.). In the "crosslinking agent" column, "uril" is tetramethoxymethylglycol uril, and "urea" is N,N'-dimethoxymethyldimethoxyethylene urea. In the "surfactant" column, "TN-80" is a non-ionic surfactant (a polyoxyethylene monoalkylether surfactant manufactured by Asahi Denka Co., Ltd.). Further, a mixed liquid of pure water (deionized water) and isopropyl alcohol (whose mass ratio was pure water (deionized water):isopropyl alcohol=82.6:0.4) was used as the other main solvent component other than the resin, the crosslinking agent, and the nitrogen-containing compound.

TABLE 1

| thickening material | resin | cross-linking agent | nitrogen-containing compound | surfactant | organic solvent/water-soluble aromatic compound |
|---|---|---|---|---|---|
| A | KW-3 (16) | uril (1.16) | tetrabutyl ammonium hydroxide (5) | TN-80 (0.25) | none |
| B | KW-3 (16) | urea (1.16) | tetrabutyl ammonium hydroxide (5) | TN-80 (0.25) | none |
| C | KW-3 (16) | uril (1.16) | 1,2-di(2-pyridyl)ethane (5) | TN-80 (0.25) | none |
| D | KW-3 (16) | uril (1.16) | 1,2-di(2-pyridyl)ethane (5) | none | γ-butyrolactone (15) |
| E | KW-3 (16) | uril (1.16) | di-2-pyridyl ketone (5) | TN-80 (0.25) | catechin (5) |
| F | KW-3 (16) | uril (1.16) | none | TN-80 (0.25) | none |

Formation of Resist Pattern

The resist pattern thickening materials A through F of the present invention which were prepared as described above were applied onto hole patterns (diameter: 200 nm) formed by ArF resists (PAR700, manufactured by Sumitomo Chemical Co., Ltd.), by a spin coating method, first under the condition of 1000 rpm/5 s, and then under the condition of 3500 rpm/40 s. Thereafter, prebaking was carried out under the condition of 85° C./70 s, and then crosslinking baking was carried out under the condition of 110° C./70 s. Thereafter, developing was carried out on the hole patterns which had been thickened by the resist pattern thickening materials A through F, by rinsing the resist pattern thickening materials A through F for 60 seconds with pure water so that the uncrosslinked portions were removed. Thus, thickened resist patterns were prepared.

The sizes of the space patterns formed by the prepared thickened resist patterns are shown in Table 2 together with the initial pattern sizes (the sizes of the space patterns formed by the resist patterns before thickening). Note that, in Table 2, "A" through "F" correspond to the resist pattern thickening materials A through F.

TABLE 2

| thickening material | initial pattern size (nm) | size (nm) of space pattern formed by thickened resist pattern |
|---|---|---|
| A | 201.5 | 186.2 |
| B | 202.4 | 183.2 |
| C | 200.4 | 180.0 |
| D | 201.3 | 179.5 |
| E | 199.8 | 181.7 |
| F | 203.0 | 179.5 |

The resist pattern thickening materials A through F of the present invention which were prepared as described above were applied onto line-and-space patterns (line size: 0.15 μm, space size: 0.15 μm) formed by ArF resists (PAR700, manufactured by Sumitomo Chemical Co., Ltd.), by a spin coating method, first under the condition of 1000 rpm/5 s, and then under the condition of 3500 rpm/40 s. Thereafter, prebaking was carried out under the condition of 85° C./70 s, and then crosslinking baking was carried out under the condition of 110° C./70 s. Thereafter, developing was carried out on the line-and-space patterns which had been thickened by the resist pattern thickening materials A through F, by rinsing the resist pattern thickening materials A through F for 60 seconds with pure water so that the uncrosslinked portions were removed. Thus, thickened resist patterns were prepared.

The sizes of the space patterns formed by the prepared thickened resist patterns are shown in Table 3 together with the initial pattern sizes (the sizes of the space patterns formed by the resist patterns before thickening). Note that, in Table 3, "A" through "F" correspond to the resist pattern thickening materials A through F.

TABLE 3

| thickening material | initial pattern size (nm) | size (nm) of space pattern formed by thickened resist pattern |
|---|---|---|
| A | 148.2 | 135.0 |
| B | 150.3 | 134.8 |
| C | 149.8 | 130.5 |
| D | 148.6 | 129.2 |
| E | 152.0 | 135.3 |
| F | 149.3 | measurement was not possible |

It can be understood that the resist pattern thickening materials of the present invention can be applied to both a hole pattern and a line-and-space pattern, and in both cases, can, regardless of the material of the resist pattern to be thickened, thicken a resist pattern to be thickened uniformly in a state in which the edge roughness is improved. When the resist pattern thickening materials of the present invention are used in forming a hole pattern, the inner diameter of the hole pattern can be made to be narrow and fine. Further, when the resist pattern thickening materials of the present invention are used in forming a line-and-space pattern, the space widths (the intervals between the line patterns) in the line-and-space pattern can be made to be small and fine. Moreover, when the resist pattern thickening materials of the present invention are used in forming an isolated pattern, the surface area of the isolated pattern can be increased.

Next, the resist pattern thickening materials C, D, F of the present invention were applied onto the surfaces of resists (resist patterns to be thickened) formed on silicon substrates, and surface layers having a thickness of 0.5 µm were formed. Etching was carried out for three minutes under the conditions of Pµ=200 W, pressure=0.02 Torr, $CF_4$ gas=100 sccm by using an etching device (a parallel plate type RIE device manufactured by Fujitsu Ltd.), on the surface layers, and on a KrF resist (UV-6 manufactured by Shipley Company, L.L.C.) for comparison, and on polymethyl methacrylate (PMMA) for comparison. The amounts of film reduction of the samples were measured, the etching rates were calculated, and relative evaluation was carried out by using the etching rate of the KrF resist as the standard.

TABLE 4

| material | etching rate (nm/min) | ratio of rates |
|---|---|---|
| UV-6 | 62.7 | 1.00 |
| PMMA | 77.0 | 1.23 |
| C | 65.8 | 1.05 |
| D | 61.0 | 1.03 |
| F | 64.0 | 1.02 |

From the results shown in Table 4, it can be understood that, because the resist pattern thickening materials of the present invention contain a nitrogen-containing compound, the etching resistances are near to that of the KrF resist and are markedly superior as compared with PMMA.

EXAMPLE 2

Figure 3A:
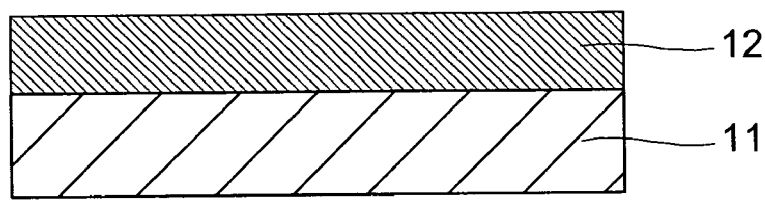
FIGS. 3A to 3D are part 1 of schematic diagrams for explaining an example of a process for manufacturing a semiconductor device having a multilayer wiring structure, by using a process for manufacturing a semiconductor device of the present invention.
Figure 3B:
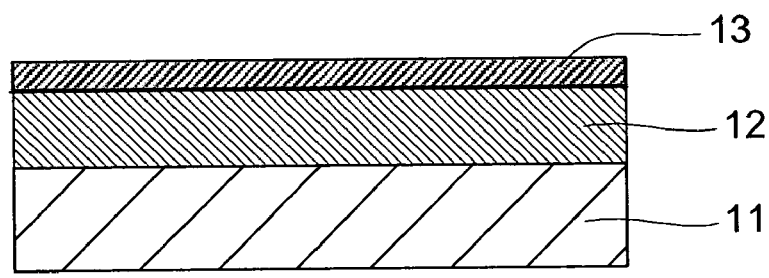
Figure 3C:
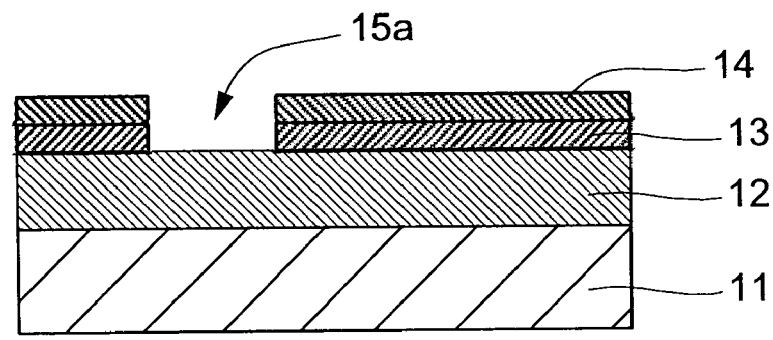
Figure 3D:
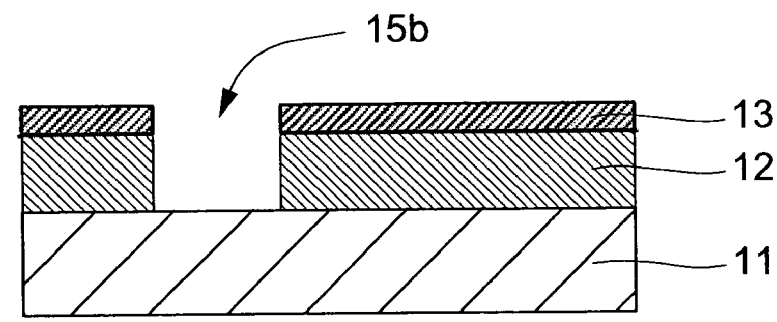

As shown in FIG. 3A, an interlayer insulating film 12 was formed on a silicon substrate 11. As shown in FIG. 3B, a titanium film 13 was formed by a sputtering method on the interlayer insulating film 12. Next, as shown in FIG. 3C, a resist pattern 14 was formed. By using the resist pattern 14 as a mask, the titanium film 13 was patterned by reactive ion etching so that openings 15a were formed. Subsequently, as shown in FIG. 3D, the resist pattern 14 was removed by reactive ion etching, and openings 15b were formed in the interlayer insulating film 12 by using the titanium film 13 as a mask.

Figure 4E:
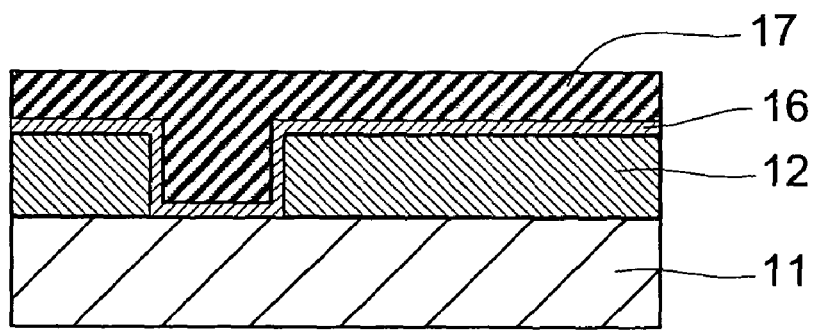
FIGS. 4E to 4H are part 2 of the schematic diagrams for explaining the example of the process for manufacturing a semiconductor device having a multilayer wiring structure, by using the process for manufacturing a semiconductor device of the present invention.
Figure 4F:
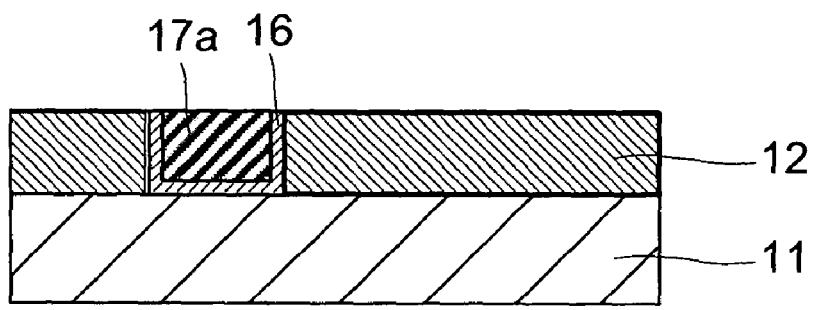

Next, the titanium film 13 was removed by wet processing, and as shown in FIG. 4E, a TiN film 16 was formed on the interlayer insulating film 12 by a sputtering method. Subsequently, a Cu film 17 was grown by an electrolytic plating method on the TiN film 16. Next, as shown in FIG. 4F, leveling was carried out by CMP so that the barrier metal and the Cu film (first metal film) remained only in the trench portions corresponding to the openings 15b (FIG. 3D), and wires 17a of a first layer were formed.

Figure 4G:
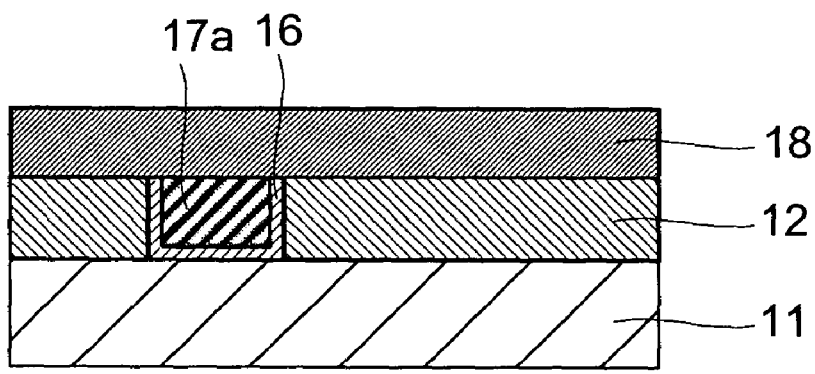
Figure 4H:
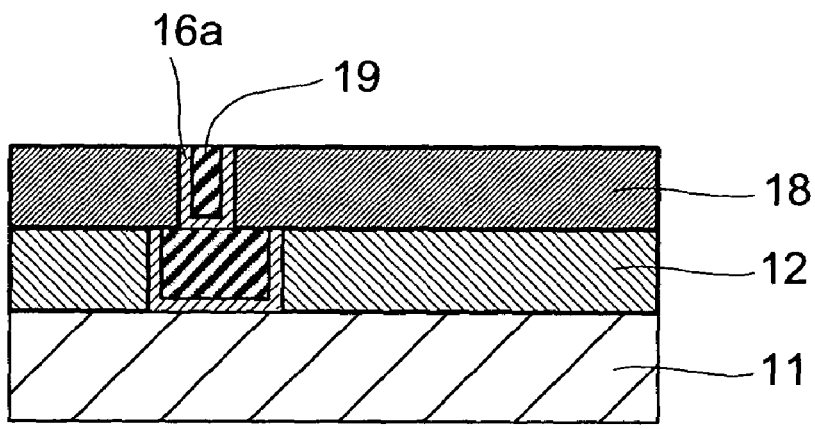

Next, as shown in FIG. 4G, an interlayer insulating film 18 was formed on the wires 17a of the first layer. Thereafter, in the same way as in FIGS. 3B through 3D and FIGS. 4E and 4F, Cu plugs (second metal films) 19 and TiN films 16a, which connected the wires 17a of the first layer to upper layer wires which would be formed later, were formed as shown in FIG. 4H.

Figure 5:
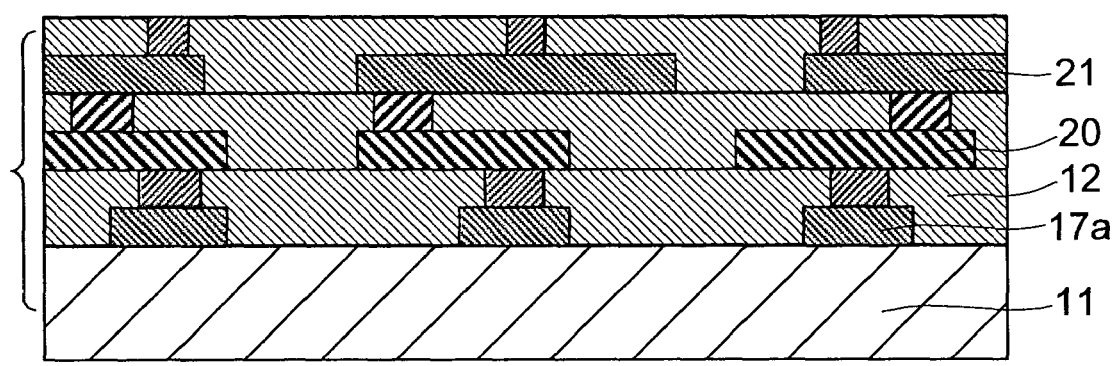
FIG. 5 is part 3 of the schematic diagrams for explaining the example of the process for manufacturing a semiconductor device having a multilayer wiring structure, by using the process for manufacturing a semiconductor device of the present invention.

By repeating the above-described respective processes, as shown in FIG. 5, a semiconductor device was manufactured which had a multilayer wiring structure having, on the silicon substrate 11, the wires 17a of the first layer, wires 20 of a second layer, and wires 21 of a third layer. Note that the barrier metal layers formed beneath the wires of the respective layers are not shown in FIG. 5.

In present Example 2, the resist pattern 14 is a resist pattern formed in the same way as in the case of Example 1, by using the resist pattern thickening material of the present invention.

EXAMPLE 3

Flash Memory and Process for Manufacturing Thereof

Example 3 is an example of the semiconductor device and process for manufacturing thereof of the present invention using the resist pattern thickening material of the present invention. Note that, in Example 3, resist films 26, 27, 29, 32 and 34 which will be described hereinafter are resist films which have been thickened by the same process as in Examples 1 and 2 by using the resist pattern thickening material of the present invention.

Figure 6A:
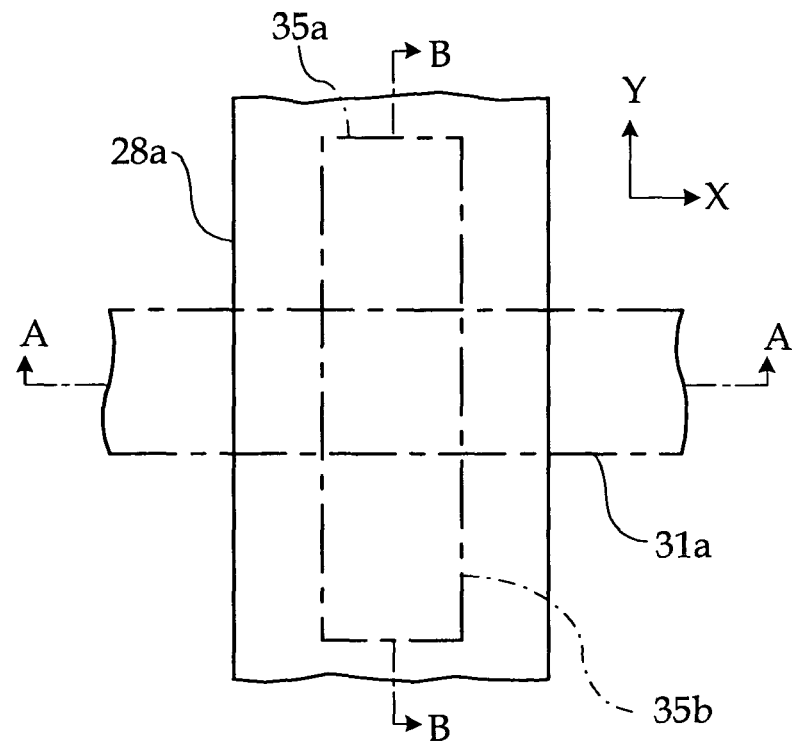
FIGS. 6A and 6B are top views for explaining a FLASH EPROM which is one example of a semiconductor device of the present invention.
Figure 6B:
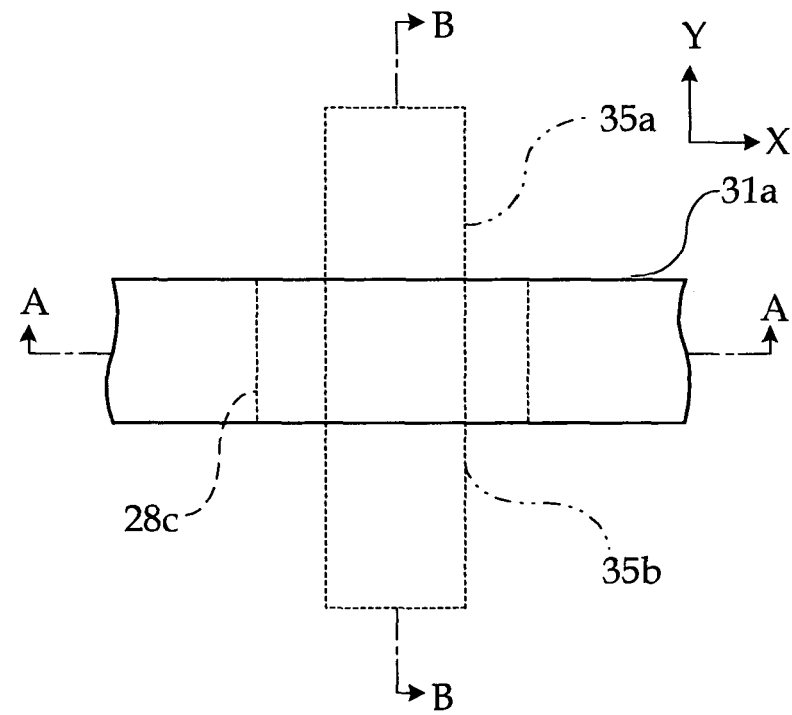

FIGS. 6A and 6B are top views (plan views) of a FLASH EPROM which is called a FLOTOX type or an ETOX type. Note that FIGS. 7A through 7C, FIGS. 8D through 8F, and FIGS. 9G through 9I are cross-sectional schematic views for explaining an example of a process for manufacturing the FLASH EPROM. In FIGS. 7A through 9I, the illustrations at the left sides are the memory cell portion (a first element region), and are schematic diagrams of the cross-section (the A direction cross-section) of the gate widthwise direction (the X direction in FIGS. 6A and 6B) of the portion at which a MOS transistor having a floating gate electrode is formed. The illustrations at the center are the memory cell portion, which is the same portion as in the left side drawings, and are schematic diagrams of the cross-section (the B direction cross-section) of the gate lengthwise direction (the Y direction in FIGS. 6A and 6B) which is orthogonal to the X direction. The illustrations at the right side are schematic diagrams of the cross-section (the A direction cross-section in FIGS. 6A and 6B) of the portion of the peripheral circuit portion (a second element region) at which a MOS transistor is formed.

First, as shown in FIG. 7A, a field oxide film 23 formed by a $SiO_2$ film was selectively formed at the element isolation region on a p-type Si substrate 22. Thereafter, a first gate insulating film 24a was formed at the MOS transistor of the memory cell portion (the first element region), by an $SiO_2$ film by thermal oxidation so as to become a thickness of 10 nm (100 Å) to 30 nm (300 Å). In a separate process, a second gate insulating film 24b was formed at the MOS transistor of the peripheral circuit portion (the second element region), by an $SiO_2$ film by thermal oxidation so as to become a thickness of 10 nm (100 Å) to 50 nm (500 Å). Note that, when the first gate insulating film 24a and the second gate insulating film 24b are the same thickness, these oxide films may be formed simultaneously in the same process.

Next, in order to form a MOS transistor having depression type n-channels at the memory cell portion (the left side and the center in FIG. 7A), the peripheral circuit portion (the right side in FIG. 7A) was masked by the resist film 26 for the purpose of controlling the threshold voltage. Then, phosphorus (P) or arsenic (As) was introduced, as an n-type impurity in a dosage amount of $1\times10^{11}$ $cm^{-2}$ to $1\times10^{14}$ $cm^{-2}$ by an ion implantation method, into the regions which were to become the channel regions directly beneath the floating gate electrodes, so that a first threshold value control layer 25a was formed. Note that the dosage amount and the conductive type of the impurity at this time can be appropriately selected in accordance with whether depression type channels or accumulation type channels are to be formed.

Next, in order to form a MOS transistor having depression type n-channels at the peripheral circuit portion (the right side in FIG. 7B), the memory cell portion (the left side and the center in FIG. 7B) was masked by the resist film 27 for the purpose of controlling the threshold voltage. Then, phosphorus (P) or arsenic (As) was introduced, as an n-type impurity in a dosage amount of $1\times10^{11}$ cm$^{-2}$ to $1\times10^{14}$ cm$^{-2}$ by an ion implantation method, into the regions which were to become the channel regions directly beneath the gate electrodes, so that a second threshold value control layer 25b was formed.

Next, a first polysilicon film (a first conductor film) 28 having a thickness of 50 nm (500 Å) to 200 nm (2000 Å) was applied over the entire surface as a floating gate electrode of the MOS transistor at the memory cell portion (the left side and the center in FIG. 7C) and as a gate electrode of the MOS transistor at the peripheral circuit portion (the right side in FIG. 7C).

Figure 8D:
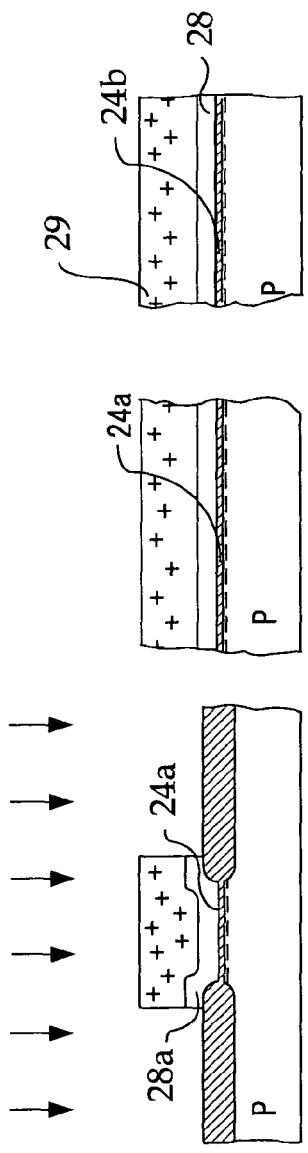
FIGS. 8D to 8F are part 2 of the set of cross-sectional schematic diagrams for explaining the process for manufacturing the FLASH EPROM which is an example of the process for manufacturing a semiconductor device of the present invention.

Thereafter, as shown in FIG. 8D, the first polysilicon film 28 was patterned by using the resist film 29 formed as a mask, so that a floating gate electrode 28a was formed at the MOS transistor at the memory cell portion (the left side and the center in FIG. 8D). At this time, as shown in FIG. 8D, in the X direction, patterning was carried out so as to obtain the final width, and in the Y direction, the region which was to become the S/D region layer remained covered by the resist film 29 without patterning.

Figure 8E:
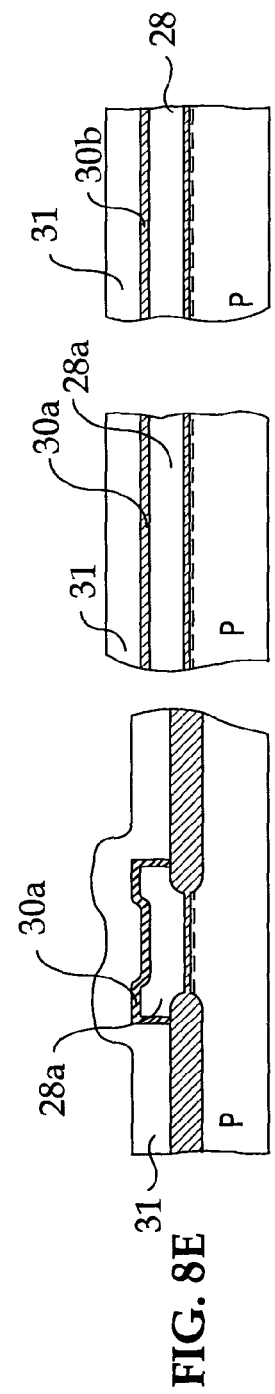

Next, as shown in the left side and the center of FIG. 8E, after the resist film 29 was removed, a capacitor insulating film 30a formed of a SiO$_2$ film was formed by thermal oxidation to a thickness of approximately of 20 nm (200 Å) to 50 nm (500 Å) so as to cover the floating gate electrode 28a. At this time, a capacitor insulating film 30b formed of a SiO$_2$ film was formed on the first polysilicon film 28 of the peripheral circuit portion (the right side in FIG. 8E). Here, although the capacitor insulating films 30a and 30b were formed only by SiO$_2$ films, they may be formed by a composite film of two to three layers of SiO$_2$ and Si$_3$N$_4$ films.

Next, as shown in FIG. 8E, a second polysilicon film (a second conductor film) 31, which was to become a control gate electrode, was formed to a thickness of 50 nm (500 Å) to 200 nm (2000 Å) so as to cover the floating gate electrode 28a and the capacitor insulating film 30a.

Figure 8F:
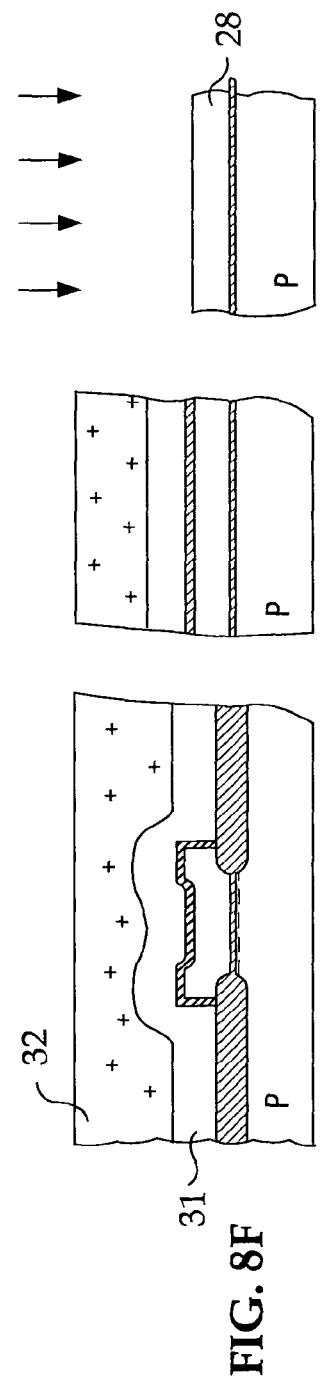

Then, as shown in FIG. 8F, the memory portion (the left side and the center of FIG. 8F) was masked by the resist film 32, and the second polysilicon film 31 and the capacitor insulating film 30b of the peripheral circuit portion (the right side in FIG. 8F) were successively removed by etching so that the first polysilicon film 28 was exposed at the surface.

Figure 9G:
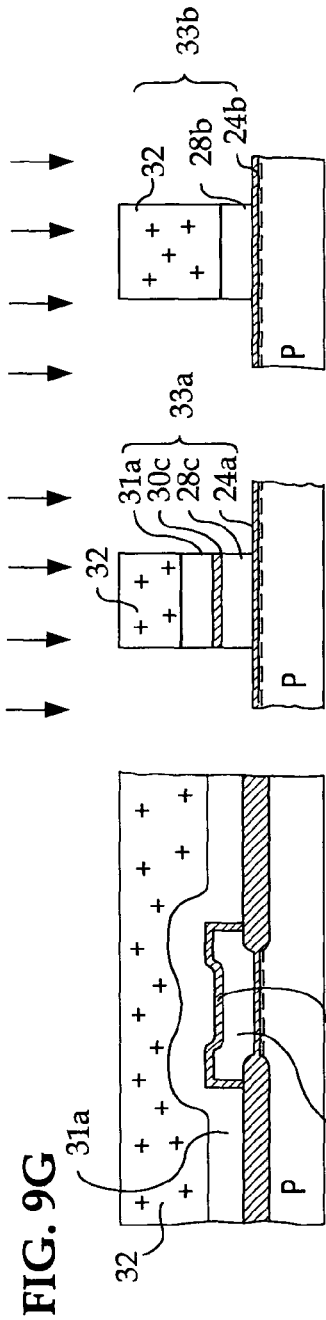
FIGS. 9G to 9I are part 3 of the set of cross-sectional schematic diagrams for explaining the process for manufacturing the FLASH EPROM which is an example of the process for manufacturing a semiconductor device of the present invention.

Subsequently, as shown in FIG. 9G, the second polysilicon film 31, the capacitor insulating film 30a and the first polysilicon film 28a which had been patterned only in the X direction, of the memory portion (the left side and the center of FIG. 9G), were, by using the resist film 32 as a mask, subjected to patterning in the Y direction so as to become the final dimension of a first gate portion 33a. A laminate structure formed by a control gate electrode 31a/a capacitor insulating film 30c/a floating gate electrode 28c, which had a width of approximately 1 μm in the Y direction, was formed. The first polysilicon film 28 of the peripheral circuit portion (the left side in FIG. 9G) was, by using the resist film 32 as a mask, subjected to patterning so as to become the final dimension of a second gate portion 33b, and a gate electrode 28b of a width of approximately 1 μm was formed.

Next, by using the laminate structure formed by the control gate electrode 31a/the capacitor insulating film 30c/the floating gate electrode 28c of the memory cell portion (the left side and the center of FIG. 9H) as a mask, phosphorus (P) or arsenic (As) was introduced, in a dosage amount of $1\times10^{14}$ cm$^{-2}$ to $1\times10^{16}$ cm$^{-2}$ by an ion implantation method, into the Si substrate 22 of the element forming region, so that n type S/D region layers 35a and 35b were formed. By using the gate electrode 28b at the peripheral circuit portion (the right side of FIG. 9H) as a mask, phosphorus (P) or arsenic (As) was introduced, as an n type impurity in a dosage amount of $1\times10^{14}$ cm$^{-2}$ to $1\times10^{16}$ cm$^{-2}$ by an ion implantation method, into the Si substrate 22 of the element forming region, so that S/D region layers 36a and 36b were formed.

Subsequently, the first gate portion 33a of the memory cell portion (the left side and the center of FIG. 9I) and the second gate portion 33b of the peripheral circuit portion (the right side of FIG. 9I) were covered by forming an interlayer insulating film 37 formed of a PSG film to a thickness of about 500 nm (5000 Å).

Thereafter, contact holes 38a, 38b and contact holes 39a, 39b were formed in the interlayer insulating film 37 formed on the S/D region layers 35a, 35b and the S/D region layers 36a, 36b. Then, S/D electrodes 40a, 40b and S/D electrodes 41a, 41b were formed.

Figure 9H:
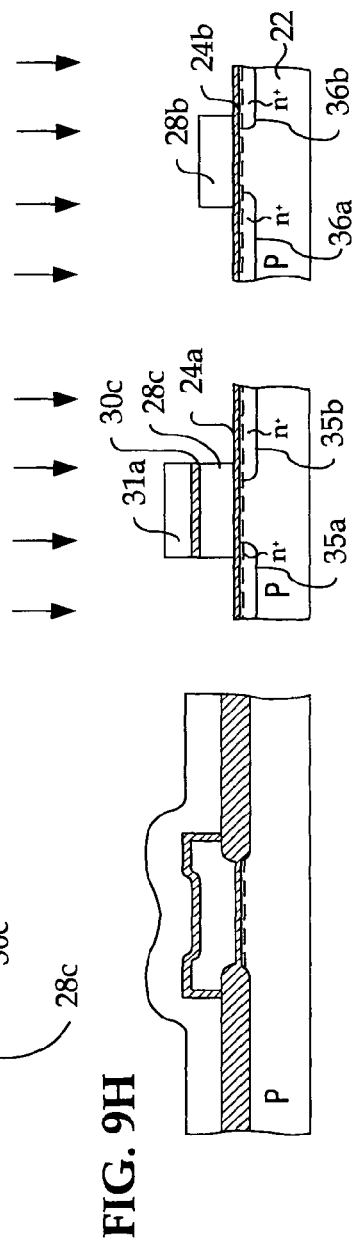
Figure 9I:
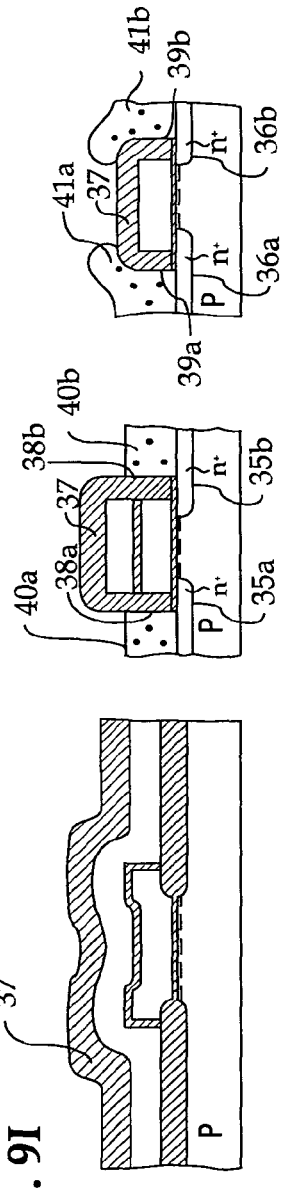

In this way, as shown in FIG. 9I, the FLASH EPROM was manufactured as a semiconductor device.

In this FLASH EPROM, the second gate insulating film 24b of the peripheral circuit portion (the right side in FIGS. 7A through 9G) is covered (refer to the right side in FIGS. 7C through 9G) by the first polysilicon film 28 or the gate electrode 28b always after formation. Thus, the second gate insulating film 24b is maintained at the thickness at which it was initially formed. Thus, it is easy to control the thickness of the second gate insulating film 24b, and easy to adjust the concentration of the conductive impurity in order to control the threshold voltage.

Note that, in the above-described example, in order to form the first gate portion 33a, first, patterning is carried out at a predetermined width in the gate widthwise direction (the X direction in FIGS. 6A and 6B), and thereafter, patterning is carried out in the gate lengthwise direction (the Y direction in FIGS. 6A and 6B) so as to attain the final predetermined width. However, conversely, patterning may be carried out at a predetermined width in the gate lengthwise direction (the Y direction in FIGS. 6A and 6B), and thereafter, patterning may be carried out in the gate widthwise direction (the X direction in FIGS. 6A and 6B) so as to attain the final predetermined width.

The example of manufacturing a FLASH EPROM shown in FIGS. 10A through 10C is the same as the above-described example, except that the processes after the process shown by FIG. 8F in the above example are changed to the processes shown in FIGS. 10A through 10C. Namely, as shown in FIG. 10A, this example differs from the above-described example only with respect to the point that a polycide film is provided by forming a high melting point metal film (a fourth conductor film) 42 formed of a tungsten (W) film or a titanium (Ti) film to a thickness of approximately 200 nm (2000 Å), on the second polysilicon film 31 of the memory cell portion shown at the left side and the center of FIG. 10A and on the first polysilicon film 28 of the peripheral circuit portion shown at the right side in FIG. 10A. The processes after FIG. 10A, namely, the processes shown in FIGS. 10B and 10C, are the same as those shown in FIGS. 9G through 9I. Explanation of the processes which are the same as those shown in FIGS. 9G through 9I is omitted. In FIGS. 10A through 10C, portions which are the same as those in FIGS. 9G through 9I are denoted by the same reference numerals.

In this way, as shown in FIG. 10C, the FLASH EPROM was manufactured as a semiconductor device.

In this FLASH EPROM, high melting point metal films (the fourth conductor films) 42a and 42b were formed on the control gate electrode 31a and the gate electrode 28b. Thus, the electrical resistance value could be decreased even more.

Note that, here, the high melting point metal films (the fourth conductor films) 42a and 42b were used as the high melting point metal film (the fourth conductor film). However, a high melting point metal silicide film such as a titanium silicide (TiSi) film or the like may be used.

Figure 11A:
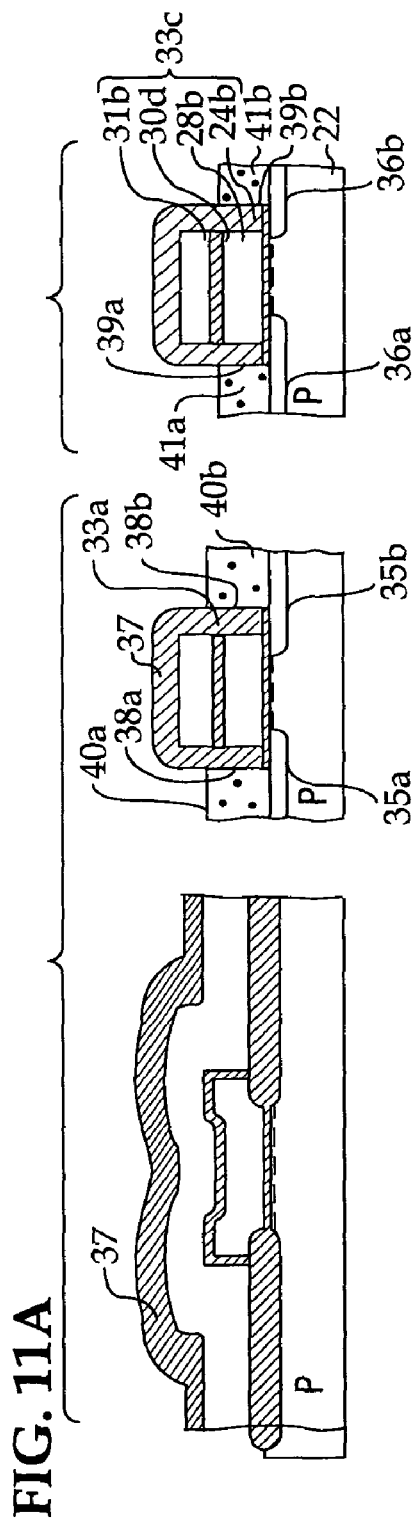
FIGS. 11A to 11C are cross-sectional schematic diagrams for explaining a process for manufacturing a FLASH EPROM which is another example of a process for manufacturing a semiconductor device of the present invention.
Figure 11B:
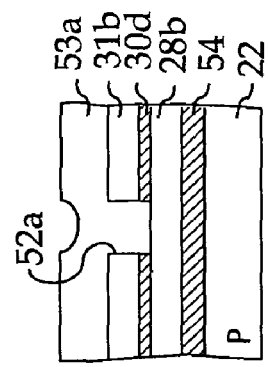
Figure 11C:
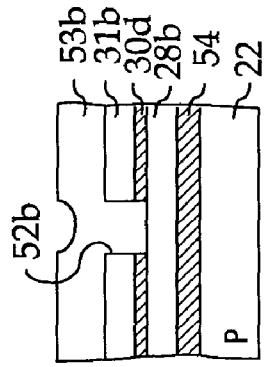

The example of manufacturing a FLASH EPROM shown in FIGS. 11A through 11C is the same as the above-described example, except that a second gate portion 33c of the peripheral circuit portion (the second element region) (the right side in FIG. 11A) also has the structure of the first polysilicon film 28b (first conductor film)/an $SiO_2$ film 30d (capacitor insulating film)/a second polysilicon film 31b (second conductor film) in the same way as the first gate portion 33a of the memory cell portion (the first element region) (the left side and center in FIG. 11A), and that the first polysilicon film 28b and the second polysilicon film 31b are short-circuited so as to form a gate electrode as shown in FIG. 11B or FIG. 11C.

Here, as shown in FIG. 11B, an opening 52a, which passes through the first polysilicon film 28b (first conductor film)/the $SiO_2$ film 30d (capacitor insulating film)/the second polysilicon film 31b (second conductor film), is formed at a different place than, for example, a second gate portion 33c shown in FIG. 11A, and is formed on such as an insulating film 54. A third conductive film, for example, a high melting point metal film 53a such as a W film or a Ti film or the like, is filled in the opening 52a. The first polysilicon film 28b and the second polysilicon film 31b are thereby short-circuited. Or, as shown in FIG. 11C, an opening 52b, which passes through the first polysilicon film 28b (first conductor film)/the $SiO_2$ film 30d (capacitor insulating film), is formed. The first polysilicon film 28b, the lower layer, is exposed at the bottom portion of the opening 52b. Thereafter, a third conductive film, for example, a high melting point metal film 53b such as a W film or a Ti film or the like, is filled in the opening 52b. The first polysilicon film 28b and the second polysilicon film 31b are thereby short-circuited.

In this FLASH EPROM, the second gate portion 33c of the peripheral circuit portion and the first gate portion 33a of the memory cell portion have the same structure. Thus, the peripheral circuit portion can be formed simultaneously with the formation of the memory cell portion. The manufacturing process can thereby be simplified, which is efficient.

Note that, here, the third conductor film 53a or 53b was formed separately from the high melting point metal film (the fourth conductor film) 42. However, they may be formed simultaneously as a common high melting point metal film.

EXAMPLE 4

Manufacture of Recording Head

Example 4 relates to the manufacture of a recording head as an applied example of the resist pattern of the present invention using the resist pattern thickening material of the present invention. Note that, in Example 4, resist patterns 102 and 126 which will be described hereinafter are resist patterns which have been thickened by the same process as in Example 1 by using the resist pattern thickening material of the present invention.

FIGS. 12A through 12D are process diagrams for explaining the manufacture of the recording head.

Figure 12A:
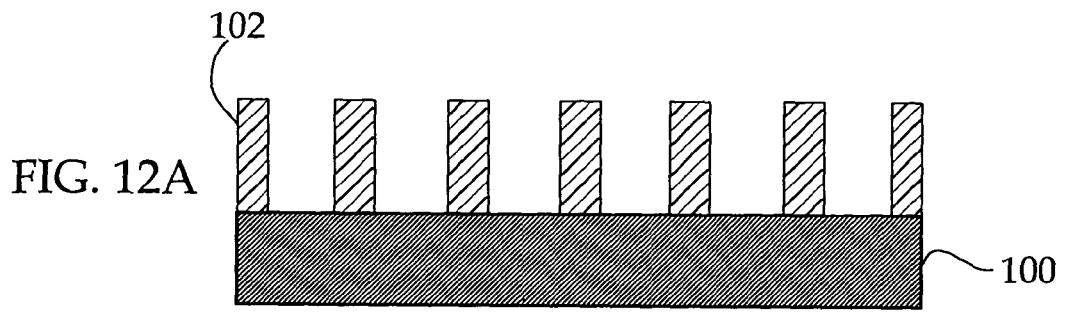
FIGS. 12A to 12D are cross-sectional schematic diagrams for explaining an example in which a resist pattern, which has been thickened by using the resist pattern thickening material of the present invention, is applied to the manufacturing of a recording head.

First, as shown in FIG. 12A, a resist film was formed to a thickness of 6 μm on an interlayer insulating film 100. Exposure and development were carried out, so as to form the resist pattern 102 having an opening pattern for formation of a spiral, thin film magnetic coil.

Figure 12B:
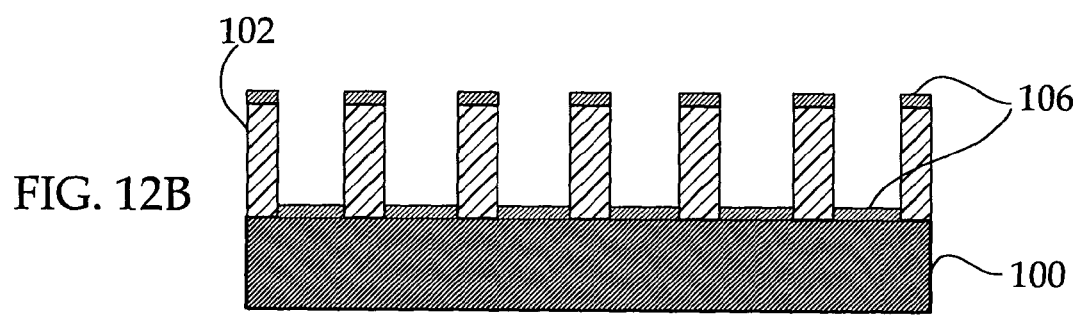

Next, as shown in FIG. 12B, a plating underlying layer 106 was formed by vapor deposition on the interlayer insulating layer 100, both on the resist pattern 102 and on the regions where the resist pattern 102 was not formed, namely, the exposed surfaces of openings 104. The plating underlying layer 106 was a laminate of a Ti adhering film having a thickness of 0.01 μm and a Cu adhering film having a thickness of 0.05 μm.

Figure 12C:
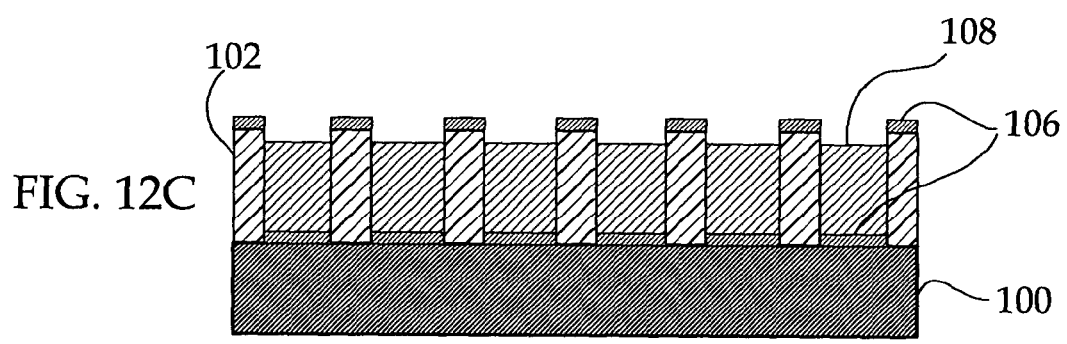

Next, as shown in FIG. 12C, a thin film conductor 108, which was formed by a Cu plating film of a thickness of 3 μm, was formed on the interlayer insulating layer 100, at the regions where the resist pattern 102 was not formed, namely, on the surfaces of the plating underlying layer 106 formed on the exposed surfaces of the openings 104.

Figure 12D:
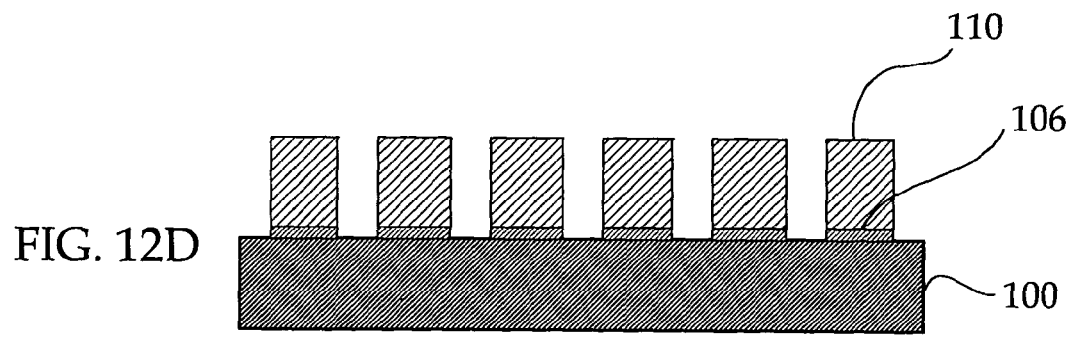

Then, as shown in FIG. 12D, when the resist pattern 102 was dissolved and removed and lifted off from the interlayer insulating layer 100, a thin film magnetic coil 110, which was formed by the spiral pattern of the thin film conductor 108, was formed.

The recording head was thereby manufactured.

At the obtained recording head, the spiral pattern was formed to be fine by the resist pattern 102 which was thickened by using the resist pattern thickening material of the present invention. Thus, the thin film magnetic coil 110 was fine and detailed, and was extremely well suited to mass production.

FIGS. 13A through 15F are process diagrams for explaining manufacture of another recording head.

Figure 13A:
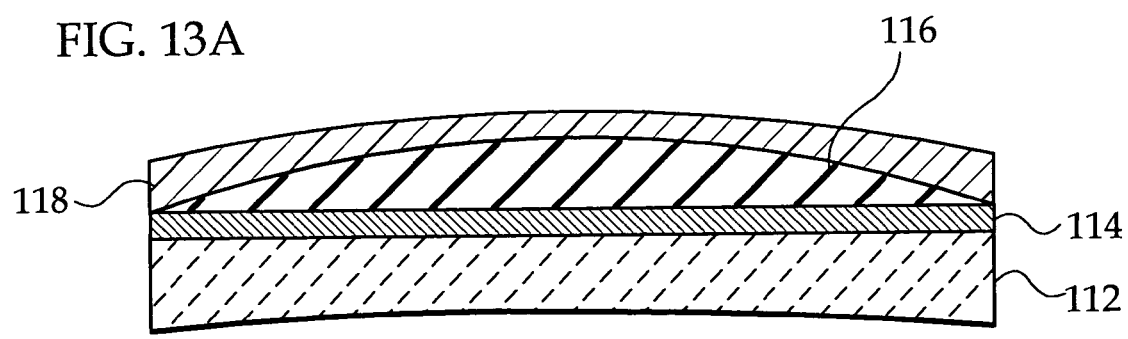
FIGS. 13A and 13B are cross-sectional schematic diagrams for explaining part 1 of a process of another example in which a resist pattern, which has been thickened by using the resist pattern thickening material of the present invention, is applied to the manufacturing of a recording head.

As shown in FIG. 13A, a gap layer 114 was formed by a sputtering method to cover a non-magnetic substrate 112 formed of ceramic. Note that an insulator layer (not illustrated) formed of silicon oxide and a conductive underlying layer (not illustrated) formed of an Ni—Fe permalloy were formed in advance by a sputtering method to cover the non-magnetic substrate 112, and a lower portion magnetic layer (not illustrated) formed of an Ni—Fe permalloy was formed on the non-magnetic substrate 112. Then, a resin insulating film 116, which was formed by a thermosetting resin, was formed on predetermined regions on the gap layer 114, except for the portions which were to become the magnetic distal end portions of the aforementioned unillustrated lower portion magnetic layer. Next, a resist material was applied on the resin insulating film 116 so as to form a resist film 118.

Figure 13B:
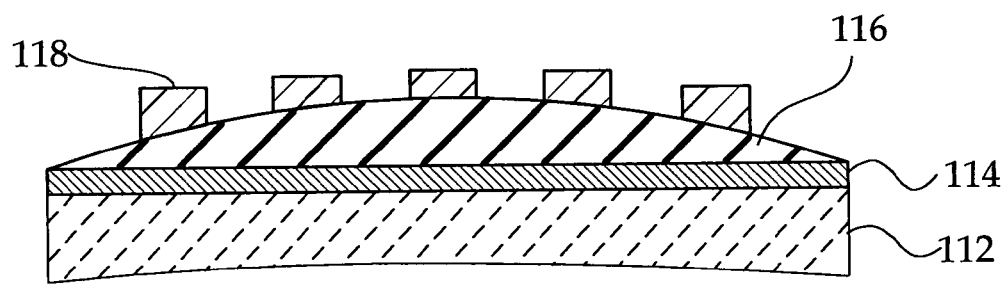
Figure 14C:
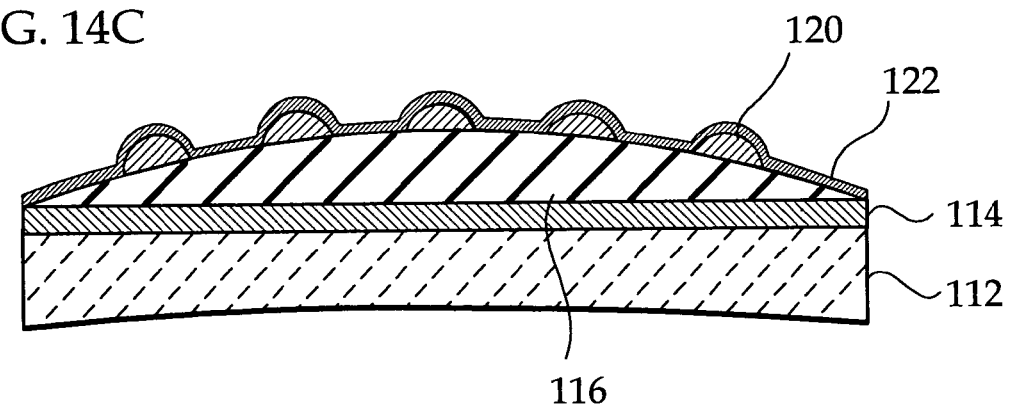
FIGS. 14C and 14D are cross-sectional schematic diagrams for explaining part 2 of the process of the other example in which the resist pattern, which has been thickened by using the resist pattern thickening material of the present invention, is applied to the manufacturing of the recording head.

Then, as shown in FIG. 13B, the resist film 118 was exposed and developed, so that a spiral pattern was formed. Subsequently, as shown in FIG. 14C, the resist film 118 of the spiral pattern was subjected to thermosetting processing for about one hour at a temperature of several hundred degrees Celsius, so that a first spiral pattern 120, which was shaped as projections, was formed. Then, a conductive underlying layer 122 formed of Cu was formed to cover the surface of the first spiral pattern 120.

Figure 14D:
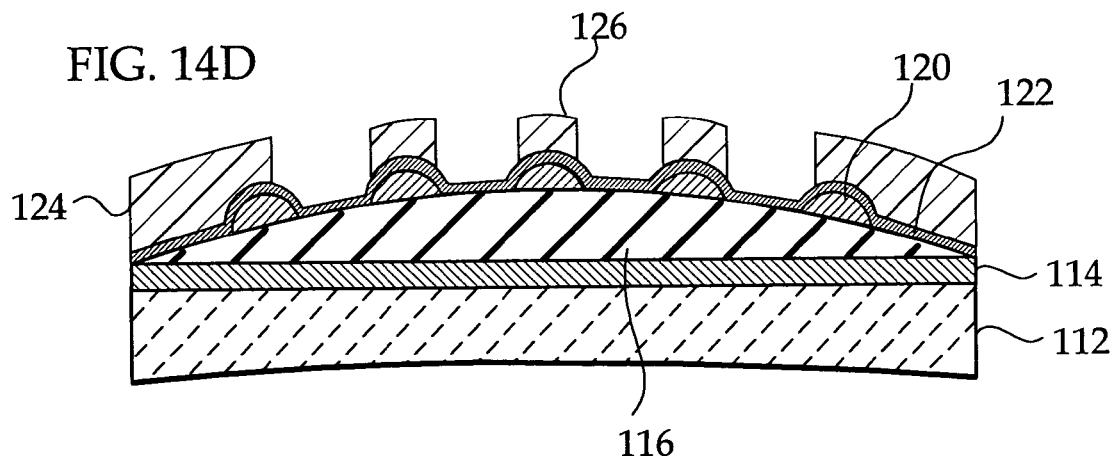

Next, as shown in FIG. 14D, a resist material was applied on the conductive underlying layer 122 by a spin coating method so as to form a resist film 124. Thereafter, the resist film 124 was patterned on the first spiral pattern 120, so that the resist pattern 126 was formed.

Figure 15E:
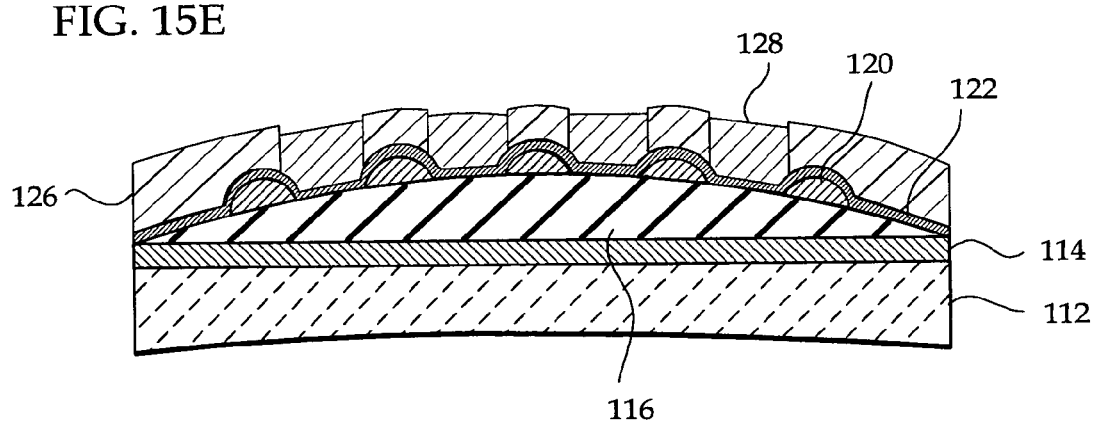
FIGS. 15E and 15F are cross-sectional schematic diagrams for explaining part 3 of the process of the other example in which the resist pattern, which has been thickened by using the resist pattern thickening material of the present invention, is applied to the manufacturing of the recording head.
Figure 15F:
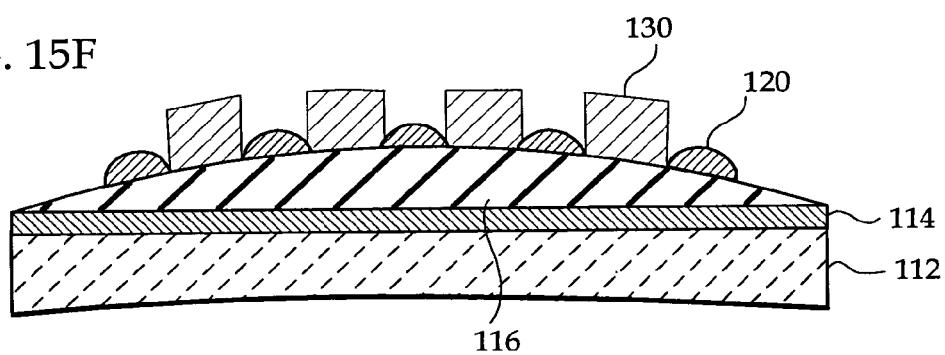

Then, as shown in FIG. 15E, a Cu conductor layer 128 was formed by a plating method on the exposed surface of the conductive underlying layer 122, namely, at the regions where the resist pattern 126 was not formed. Thereafter, as shown in FIG. 15F, by melting and removing the resist pattern 126, the resist pattern 126 was lifted-off from the conductive underlying layer 122, so that a spiral, thin film magnetic coil 130 formed of the Cu conductor layer 128 was formed.

Figure 16:
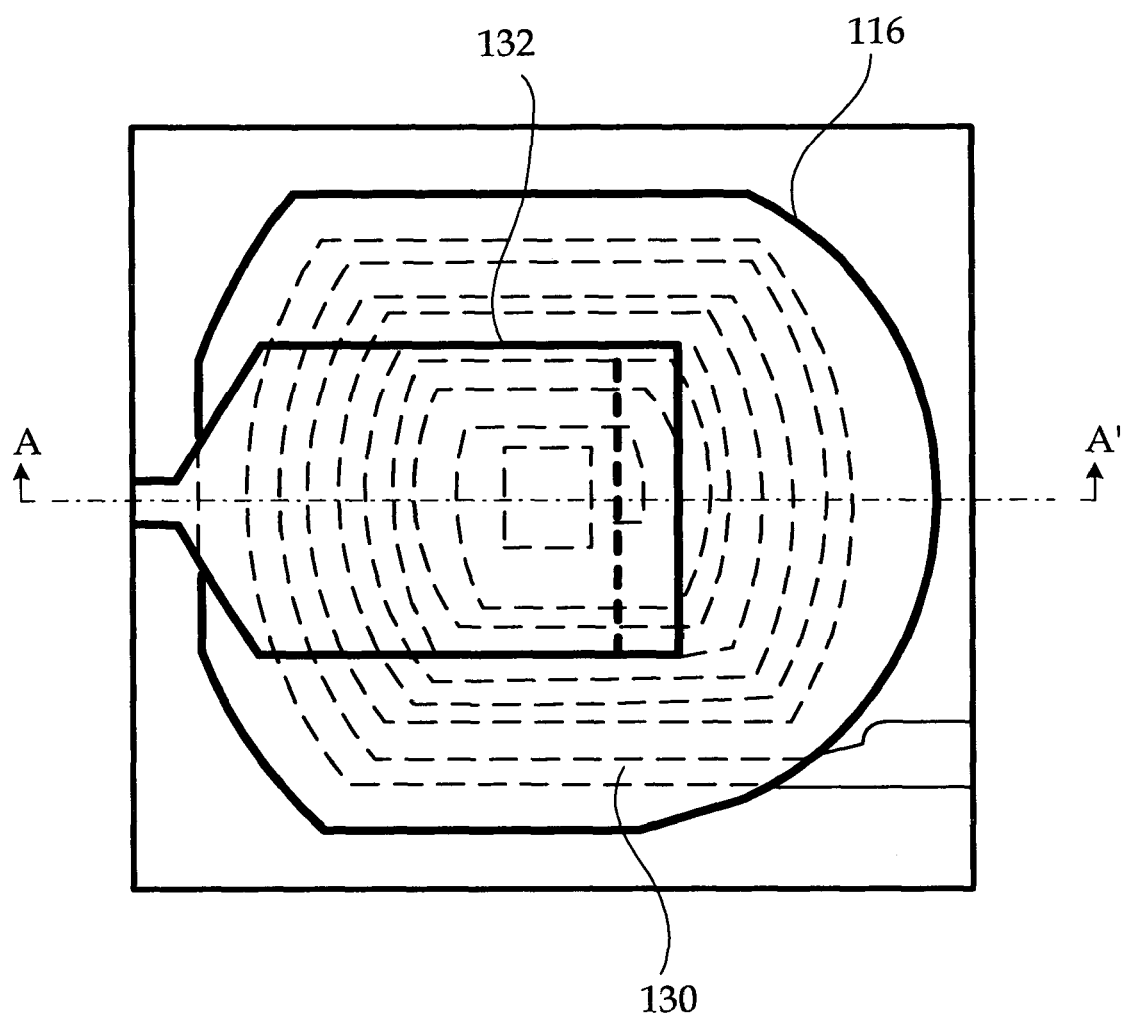
FIG. 16 is a plan view showing an example of the recording head manufactured by the processes of FIGS. 13A to 15F.

In this way, a recording head, such as that shown in plan view in FIG. 16, was manufactured which had a magnetic layer 132 on the resin insulating film 116 and had the thin film magnetic coil 130 on the surface.

At the obtained recording head, the spiral pattern was formed to be fine by the resist pattern 126 which was thickened by using the resist pattern thickening material of the present invention. Therefore, the thin film magnetic coil 130 was fine and detailed, and was extremely well suited to mass production.

The present invention provides a process for forming a resist pattern which, when patterning a resist pattern, can utilize, as is, light sources (such as ArF excimer laser light and the like) of existing exposure devices, and which has excellent mass productivity, and which can finely, uniformly, and stably form a space pattern having reduced surface roughness, exceeding the exposure limits of such light sources, regardless of the material and the size of the resist pattern to be thickened.

Further, the present invention provides a resist pattern thickening material which, when applied on a resist pattern to be thickened, can efficiently, uniformly, and stably thicken the resist pattern to be thickened so that surface roughness is reduced, regardless of the material and the size of the resist pattern to be thickened, and which is suitable for forming a fine space pattern, exceeding the exposure limits of light sources of existing exposure devices.

In addition, the present invention provides a process for manufacturing a semiconductor device which, by using a space pattern, which has been formed to be fine and uniform, as a mask pattern, can form a fine pattern on an underlying layer which is an oxide film or the like, and which can efficiently mass produce high-performance semiconductor devices having fine wiring and the like.

What is claimed is:

1. A resist pattern thickening material comprising:
a resin;
a crosslinking agent;
a nitrogen-containing compound;
pure water; and
a polyphenol compound as a water-soluble aromatic compound,
wherein the nitrogen-containing compound is one of amine, amide, imide, quaternary ammonium, and a derivative thereof,
wherein the resin is at least one of polyvinyl alcohol, polyvinyl acetal, and polyvinyl acetate.

2. A resist pattern thickening material according to claim 1, wherein the nitrogen-containing compound is a basic compound.

3. A resist pattern thickening material according to claim 1, wherein the resist pattern thickening material exhibit at least one of water-solubility and alkali-solubility.

4. A resist pattern thickening material according to claim 1, wherein the crosslinking agent is at least one of a melamine derivative, a urea derivative, and an uril derivative.

5. A resist pattern thickening material according to claim 1, further comprising a resin containing an aromatic compound in a portion thereof.

6. A resist pattern thickening material according to claim 1, further comprising an organic solvent.

7. A resist pattern thickening material according to claim 6, wherein the organic solvent is at least one of an alcohol solvent, a chain ester solvent, a cyclic ester solvent, a ketone solvent, a chain ether solvent, and a cyclic ether solvent.

8. A resist pattern thickening material according to claim 1,
wherein the resist pattern thickening material further comprises a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

9. A resist pattern thickening material comprising:
a first resin;
a crosslinking agent;
a nitrogen-containing compound;
pure water; and
a second resin containing an aromatic compound in a portion thereof,
wherein the second resin containing the aromatic compound in a portion thereof is at least one of a polyvinyl aryl acetal resin, a polyvinyl aryl ether resin, and a polyvinyl aryl ester resin.

10. A resist pattern comprising:
an inner layer of a resist pattern; and
a surface layer of a resist pattern provided on the inner layer, the surface layer being a resist pattern thickening material comprising:
a resin;
a crosslinking agent;
a nitrogen-containing compound;
pure water; and
a polyphenol compound as a water-soluble aromatic compound,
wherein the nitrogen-containing compound is one of amine, amide, imide, quaternary ammonium, and a derivative thereof,
wherein the resin is at least one of polyvinyl alcohol, polyvinyl acetal, and polyvinyl acetate.

11. A resist pattern according to claim 10,
wherein the resist pattern thickening material further comprises a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

12. A process for forming a resist pattern, comprising:
applying a resist pattern thickening material onto a resist pattern to be thickened after forming the resist pattern to be thickened so as to cover a surface of the resist pattern to be thickened,
wherein the resist pattern thickening material comprises:
a resin;
a crosslinking agent;
a nitrogen-containing compound;
pure water; and
a polyphenol compound as a water-soluble aromatic compound,
wherein the nitrogen-containing compound is one of amine, amide, imide, quaternary ammonium, and a derivative thereof,
wherein the resin is at least one of polyvinyl alcohol, polyvinyl acetal, and polyvinyl acetate.

13. A process for forming a resist pattern according to claim 12, wherein a material of the resist pattern to be thickened is at least one of a novolak resist, a polyhydroxystyrene (PHS) resist, an acrylic resist, a cycloolefin-maleic acid anhydride resist, a cycloolefin resist, and a cycloolefin-acryl hybrid resist.

14. A process for forming a resist pattern according to claim 12, further comprising:
developing the resist pattern thickening material, after applying the resist pattern thickening material.

15. A process for forming a resist pattern thickening material according to claim 12,
wherein the resist pattern thickening material farther comprises a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

16. A semiconductor device comprising:
a pattern formed by using a resist pattern thickened by using a resist pattern thickening material,
wherein the resist pattern thickening material comprises:
a resin;
a crosslinking agent;
a nitrogen-containing compound;
pure water; and
a polyphenol compound as a water-soluble aromatic compound,
wherein the nitrogen-containing compound is one of amine, amide, imide, quaternary ammonium, and a derivative thereof,
wherein the resin is at least one of polyvinyl alcohol, polyvinyl acetal, and polyvinyl acetate.

17. A semiconductor device according to claim 16,
wherein the resist pattern thickening material further comprises a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

18. A process for manufacturing a semiconductor device comprising:
applying a resist pattern thickening material onto a resist pattern to be thickened, after the resist pattern to be thickened is formed, so as to thicken the resist pattern to be thickened and form the resist pattern; and
patterning the underlying layer by etching using the resist pattern as a mask so as to pattern the underlying layer,
wherein the resist pattern thickening material comprises:
a resin;
a crosslinking agent;
a nitrogen-containing compound;
pure water; and
a polyphenol compound as a water-soluble aromatic compound,
wherein the nitrogen-containing compound is one of amine, amide, imide, quaternary ammonium, and a derivative thereof,
wherein the resin is at least one of polyvinyl alcohol, polyvinyl acetal, and polyvinyl acetate.

19. A process for manufacturing a semiconductor device according to claim 18,
wherein the resist pattern thickening material further comprises a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant.

20. A resist pattern thickening material comprising:
a resin;
a crosslinking agent;
a nitrogen-containing compound;
pure water; and
a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant and an ethylene diamine surfactant,
wherein the nitrogen-containing compound is one of imide, quaternary ammonium, and a derivative thereof,
wherein the resin is at least one of polyvinyl alcohol, polyvinyl acetal, and polyvinyl acetate.

21. A resist pattern comprising:
an inner layer of a resist pattern; and
a surface layer of a resist pattern provided on the inner layer, the surface layer being a resist pattern thickening material comprising:
a resin;
a crosslinking agent;
a nitrogen-containing compound;
pure water; and
a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound a primary alcohol ethoxylate compound, a phenol ethoxylate compound, an alkoxylate surfactant, a fatty acid ester surfactant, an amide surfactant, an alcohol surfactant, and an ethylene diamine surfactant, wherein the nitrogen-containing compound is one of imide, quaternary ammonium, and a derivative thereof, wherein the resin is at least one of polyvinyl alcohol, polyvinyl alcohol, and polyvinyl acetate.

22. A process for forming a resist pattern comprising:

applying a resist pattern thickening material onto a resist pattern to be thickened after forming the resist pattern to be thickened so as to cover a surface of the resist pattern to be thickened, wherein the resist pattern thickening material comprises:

a resin;

a crosslinking agent;

a nitrogen-containing compound;

pure water; and a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant, wherein the nitrogen-containing compound is one of imide, quaternary ammonium, and a derivative thereof, wherein the resin is at least one of polyvinyl alcohol, polyvinyl acetal, and polyvinyl acetate.

23. A semiconductor device comprising:

a pattern formed by using a resist pattern thickened by using a resist pattern thickening material, wherein the resist pattern thickening material comprises:

a resin;

a crosslinking agent;

a nitrogen-containing compound;

pure water; and a nonionic surfactant which is at least one of a polyoxyethylene-polyoxypropylene condensation product, polyoxyalkylene alkylether compound a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant, wherein the nitrogen-containing compound is one of imide, quaternary ammonium, and a derivative thereof, wherein the resin is at least one of polyvinyl alcohol, polyvinyl acetal, and polyvinyl acetate.

24. A process for manufacturing a semiconductor device comprising:

applying a resist pattern thickening material onto a resist pattern to be thickened, after the resist pattern to be thickened is formed, so as to thicken the resist pattern to be thickened and form the resist pattern; and patterning the underlying layer by etching using the resist pattern as a mask so as to pattern the underlying layer, wherein the resist pattern thickening material comprises:

a resin;

a crosslinking agent;

a nitrogen-containing compound;

pure water; and a nonionic surfactant which is at least one of a polyoxyethylene-polyoxypropylene condensation product, polyoxyalkylene alkylether compound, a polyoxyethylene alkylether compound, a sorbitan fatty acid ester compound, a glycerin fatty acid ester compound, a primary alcohol ethoxylate compound, a phenol ethoxylate compound, an alkoxylate surfactant, a fatty acid ester surfactant, an amide surfactant, an alcohol surfactant, and an ethylene diamine surfactant, wherein the nitrogen-containing compound is one of imide, quaternary ammonium, and a derivative thereof, wherein the resin is at least one of polyvinyl alcohol, polyvinyl acetal, and polyvinyl acetate.

* * * * *

UNITED STATES PATENT AND TRADEMARK OFFICE
CERTIFICATE OF CORRECTION

PATENT NO. : 7,364,829 B2
APPLICATION NO. : 10/629806
DATED : April 29, 2008
INVENTOR(S) : Miwa Kozawa et al.

It is certified that error appears in the above-identified patent and that said Letters Patent is hereby corrected as shown below:

On the Title Page;
In item (45) Date of Patent, change "Apr. 29, 2008" to be -- *Apr. 29, 2008 --.
And in item (*) Notice, insert -- This patent is subject to a terminal disclaimer -- below the last line in that item.

Signed and Sealed this

Twelfth Day of August, 2008

JON W. DUDAS
*Director of the United States Patent and Trademark Office*